(12) United States Patent
Iwahata et al.

(10) Patent No.: US 11,094,564 B2
(45) Date of Patent: Aug. 17, 2021

(54) PROCESSING LIQUID SUPPLYING APPARATUS, SUBSTRATE PROCESSING APPARATUS AND PROCESSING LIQUID SUPPLYING METHOD

(71) Applicant: SCREEN Holdings Co., Ltd., Kyoto (JP)

(72) Inventors: Shota Iwahata, Kyoto (JP); Ayumi Higuchi, Kyoto (JP); Eri Fujita, Kyoto (JP); Yoshiyuki Fujitani, Kyoto (JP); Masako Mano, Kyoto (JP); Yusuke Takematsu, Kyoto (JP); Yosuke Okuya, Kyoto (JP)

(73) Assignee: SCREEN Holdings Co., Ltd.

( * ) Notice: Subject to any disclaimer, the term of this patent is extended or adjusted under 35 U.S.C. 154(b) by 109 days.

(21) Appl. No.: 16/168,949

(22) Filed: Oct. 24, 2018

(65) Prior Publication Data
US 2019/0131144 A1    May 2, 2019

(30) Foreign Application Priority Data

Oct. 26, 2017   (JP) .............................. JP2017-207343

(51) Int. Cl.
*H01L 21/67* (2006.01)
*B08B 3/14* (2006.01)
*C25D 17/02* (2006.01)

(52) U.S. Cl.
CPC .......... *H01L 21/67017* (2013.01); *B08B 3/14* (2013.01); *C25D 17/02* (2013.01);
(Continued)

(58) Field of Classification Search
CPC ............... H01L 21/67; H01L 21/67017; H01L 21/6715; H01L 21/67109; H01L 21/67248;
(Continued)

(56) References Cited

U.S. PATENT DOCUMENTS 6,901,685 B2    6/2005    Yamaguchi et al. ............ 34/487
2002/0001403 A1   1/2002    Kikuchi ........................ 382/145
(Continued)

FOREIGN PATENT DOCUMENTS

JP    02-138427 A    11/1990
JP    10-275794 A    10/1998
(Continued)

*Primary Examiner* — Walter D. Griffin
*Assistant Examiner* — Cameron J Allen
(74) *Attorney, Agent, or Firm* — Ostrolenk Faber LLP

(57) ABSTRACT

A processing liquid supplying apparatus supplies a processing liquid to a processing unit which processes a substrate. The processing liquid supplying apparatus includes a supply pipe to which a processing liquid inside a processing liquid tank that stores the processing liquid is fed and which supplies the processing liquid, which is fed from the processing liquid tank, to the processing unit, a return pipe which is branched and connected to the supply pipe to return a processing liquid inside the supply pipe to the processing liquid tank, a first heating unit which heats a processing liquid inside an upstream-side portion to be heated that is set in the supply pipe upstream from a branched position to which the return pipe is connected, a second heating unit which heats a processing liquid inside a downstream-side portion to be heated that is set in the supply pipe downstream from the branched position, a cooling unit which cools a processing liquid inside a portion to be cooled that is set in the return pipe, and a first filter which is interposed in the supply pipe upstream from the upstream-side portion to be heated and removes particles in a processing liquid.

22 Claims, 10 Drawing Sheets

(52) U.S. Cl.
CPC .... *H01L 21/6715* (2013.01); *H01L 21/67051* (2013.01); *H01L 21/67109* (2013.01); *H01L 21/67178* (2013.01); *H01L 21/67248* (2013.01); *H01L 21/67253* (2013.01)

(58) Field of Classification Search
CPC ......... H01L 21/67253; H01L 21/67051; H01L 21/67178; B08B 3/14; C25D 17/02
See application file for complete search history.

(56) References Cited

U.S. PATENT DOCUMENTS

| | | | |
|---|---|---|---|
| 2003/0045104 A1* | 3/2003 | Fujishima | H01L 21/67248 438/689 |
| 2007/0175387 A1 | 8/2007 | Kimura | 118/429 |
| 2012/0074102 A1 | 3/2012 | Magara et al. | 216/83 |
| 2013/0306238 A1* | 11/2013 | Miura | B01F 3/04503 156/345.11 |
| 2014/0075984 A1 | 3/2014 | Sugawara et al. | 62/606 |
| 2015/0053285 A1 | 2/2015 | Nakashima et al. | 137/565.11 |
| 2015/0262811 A1 | 9/2015 | Ogawa et al. | |
| 2015/0375273 A1 | 12/2015 | Ishii et al. | |
| 2016/0035597 A1 | 2/2016 | Hinode et al. | |
| 2016/0247697 A1* | 8/2016 | Sawashima | H01L 21/6708 |
| 2016/0288032 A1 | 10/2016 | Shite et al. | |
| 2016/0293447 A1 | 10/2016 | Iwasaki et al. | |
| 2016/0300710 A1 | 10/2016 | Oishi et al. | |
| 2017/0256426 A1 | 9/2017 | Iwao | |

FOREIGN PATENT DOCUMENTS

| | | |
|---|---|---|
| JP | 2003-297788 A | 10/2003 |
| JP | 2012-026476 A | 2/2012 |
| JP | 2014-41915 A | 3/2014 |
| JP | 2014-154860 A | 8/2014 |
| JP | 2015-41751 A | 3/2015 |
| TW | 504781 B | 10/2002 |
| TW | I334624 B | 12/2010 |
| TW | 201613012 A | 4/2016 |
| TW | 201705191 A | 2/2017 |
| TW | 201705288 A | 2/2017 |
| TW | 201706042 A | 2/2017 |
| TW | I583435 B | 5/2017 |
| TW | I602254 B | 10/2017 |

* cited by examiner

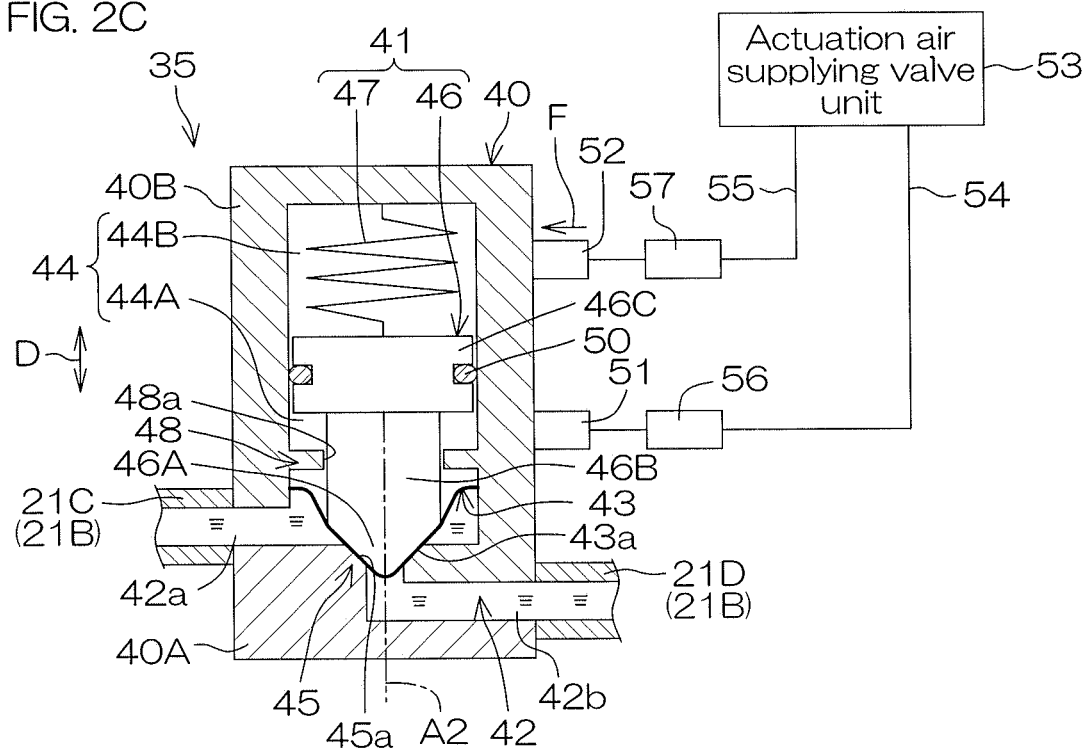
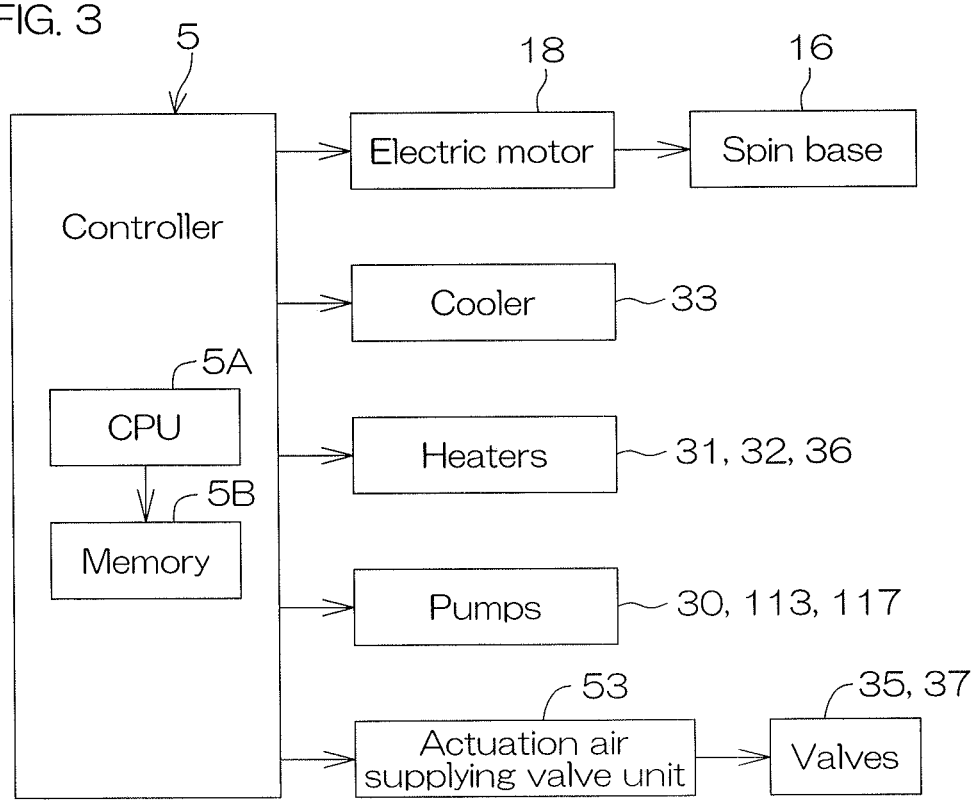

PROCESSING LIQUID SUPPLYING APPARATUS, SUBSTRATE PROCESSING APPARATUS AND PROCESSING LIQUID SUPPLYING METHOD

CROSS REFERENCE TO RELATED APPLICATIONS

The present application claims the benefit of priority to Japanese Patent Application No. 2017-207343 filed on Oct. 26, 2017 in the Japan Patent Office. The entire contents of this application are incorporated herein by reference.

BACKGROUND OF THE INVENTION

1. Field of the Invention

This invention relates to a processing liquid supplying apparatus which supplies a processing liquid to a processing unit for processing a substrate, a substrate processing apparatus which is provided with the processing liquid supplying apparatus and a processing liquid supplying method which uses the processing liquid supplying apparatus and the substrate processing apparatus.

Examples of substrates to be processed include substrates such as semiconductor wafers, substrates for liquid crystal displays, substrates for FPDs (flat panel displays) such as organic EL (electroluminescence) display devices, etc., substrates for optical disks, substrates for magnetic disks, substrates for magneto-optical disks, substrates for photomasks, ceramic substrates, and substrates for solar cells, etc.

2. Description of the Related Art

Particles are present in a processing liquid used in substrate processing. Therefore, it is necessary to remove particles from a processing liquid before supply of the processing liquid to a front surface of a substrate. On the other hand, in order to process efficiently the front surface of the substrate, there is a case that a processing liquid which has been heated is desired to be supplied to the front surface of the substrate.

Thus, in the processing liquid supplying system described in U.S. Patent Application Publication No. 2016/247697, a heater and a filter are provided on a chemical liquid flow path through which a chemical liquid (processing liquid) fed from a chemical liquid tank toward a processing unit passes.

SUMMARY OF THE INVENTION

A large number of holes are provided in a filter. Particles having a diameter larger than a diameter of the holes (pore diameter) are trapped by the filter. Thereby, the particles are removed from a processing liquid. Where the pore diameter is larger than the diameter of particles, the particles are not trapped by the filter but pass through the filter.

In the processing liquid supplying system described in U.S. Patent Application Publication No. 2016/247697, some of chemical liquid which passes through the chemical liquid flow path is returned to a tank by way of a circulation flow path. Therefore, the chemical liquid heated by the heater passes through the filter. The filter is heated by the thus heated chemical liquid. Thereby, the filter is expanded to increase the pore diameter of the holes provided in the filter. Therefore, the number of particles which are not trapped by the filter but pass through the filter may be increased. As a result, the number of particles observed on a front surface of a substrate may be increased.

Thus, an object of this invention is to provide a processing liquid supplying apparatus, a substrate processing apparatus and a processing liquid supplying method which are capable of supplying to a processing unit a processing liquid from which particles are thoroughly removed and which is sufficiently heated.

This invention provides a processing liquid supplying apparatus which supplies a processing liquid to a processing unit for processing a substrate, that is, the processing liquid supplying apparatus which includes a supply pipe to which a processing liquid inside a processing liquid tank that stores the processing liquid is fed and which supplies the processing liquid, which is fed from the processing liquid tank, to the processing unit, a return pipe which is branched and connected to the supply pipe to return a processing liquid inside the supply pipe to the processing liquid tank, a first heating unit which heats a processing liquid inside an upstream-side portion to be heated that is set in the supply pipe upstream from a branched position to which the return pipe is connected, a second heating unit which heats a processing liquid inside a downstream-side portion to be heated that is set in the supply pipe downstream from the branched position, a cooling unit which cools a processing liquid inside a portion to be cooled that is set in the return pipe, and a first filter which is interposed in the supply pipe upstream from the upstream-side portion to be heated and removes particles in a processing liquid.

According to the above-described apparatus, the first filter is interposed in the supply pipe upstream from the upstream-side portion to be heated. Therefore, the processing liquid fed from the processing liquid tank to the supply pipe passes through the first filter before being heated by the first heating unit.

Further, the processing liquid which passes through the supply pipe is returned by way of the return pipe to the processing liquid tank. That is, the processing liquid inside the processing liquid tank is circulated through the supply pipe and the return pipe. In this instance, the processing liquid is heated by the first heating unit when passing through the upstream-side portion to be heated of the supply pipe and is cooled by the cooling unit when passing through the portion to be cooled of the return pipe. Therefore, the processing liquid passes through the first filter in a thoroughly cooled state when being circulated through the supply pipe and the return pipe. Therefore, the processing liquid is circulated through the supply pipe and the return pipe, thus making it possible to sufficiently remove particles in a processing liquid.

On the other hand, the processing liquid which moves from the supply pipe to the processing unit is heated by the first heating unit when passing through the upstream-side portion to be heated and, thereafter, it is further heated by the second heating unit when passing through the downstream-side portion to be heated. Therefore, the processing liquid is sufficiently heated by the first heating unit and the second heating unit before reaching the processing unit.

As described so far, it is possible to supply to the processing unit the processing liquid from which particles are thoroughly removed and which is sufficiently heated.

In one preferred embodiment of this invention, the processing liquid supplying apparatus further includes a second filter which is interposed in the supply pipe downstream from the branched position and removes particles in a processing liquid. The processing liquid which has been heated passes through the branched position, by which the branched position may be heated to produce particles. Even in this case, the particles can be removed by the second filter.

In one preferred embodiment of this invention, the processing liquid supplying apparatus further includes an opening/closing valve which is interposed in the supply pipe downstream from the branched position. Moreover, the second filter is interposed in the supply pipe upstream from the opening/closing valve.

In a state that the opening/closing valve is closed (closed state), a processing liquid inside the processing liquid tank is not supplied to the processing unit but circulated by way of the supply pipe and the return pipe. It is, thus, possible to further remove particles from the processing liquid by the first filter before supply of the processing liquid to the processing unit.

On the other hand, in a state that the opening/closing valve is opened (open state), a processing liquid inside the processing liquid tank is supplied by way of the supply pipe to the processing unit. In general, a processing liquid is reduced in flow rate by passing through a filter. Thus, the second filter is disposed in the supply pipe upstream from the opening/closing valve, thereby making it possible to reduce an influence of the second filter on a flow rate of the processing liquid which is supplied to the processing unit.

In one preferred embodiment of this invention, the processing liquid supplying apparatus further includes an opening/closing valve which is interposed in the supply pipe downstream from the branched position. Moreover, the second filter is interposed in the supply pipe downstream from the opening/closing valve.

In a state that the opening/closing valve is closed (closed state), the processing liquid inside the processing liquid tank is not supplied to the processing unit but circulated by way of the supply pipe and the return pipe. It is, thus, possible to further remove particles from the processing liquid by the first filter before supply of the processing liquid to the processing unit.

On the other hand, in a state that the opening/closing valve is opened (open state), the processing liquid inside the processing liquid tank is supplied by way of the supply pipe to the processing unit. The second filter is positioned in the supply pipe downstream from the opening/closing valve. Thus, even where the processing liquid passes through the opening/closing valve to produce particles, it is possible to remove the particles by the second filter.

In one preferred embodiment of this invention, the processing liquid supplying apparatus further includes a third filter which is interposed in the supply pipe downstream from the upstream-side portion to be heated and upstream from the branched position and removes particles in a processing liquid. The processing liquid which has been heated passes through the supply pipe, by which components which constitute the supply pipe may dissolve into the processing liquid to produce particles. Even in this case, the particles can be removed by the third filter.

In one preferred embodiment of this invention, the processing liquid supplying apparatus further includes a fourth filter which is interposed in the return pipe upstream from the portion to be cooled and removes particles in a processing liquid. Here, the processing liquid which has been heated passes through the return pipe, by which components which constitute the return pipe may dissolve into the processing liquid to produce particles.

Thus, even where the processing liquid heated by the first heating unit passes through the return pipe to produce particles in the processing liquid, the particles can be removed by the fourth filter. Further, the fourth filter is interposed in the return pipe downstream from the supply pipe and, therefore, it is possible to suppress contamination of the processing liquid tank effectively as compared with a filter which is interposed in the supply pipe.

In one preferred embodiment of this invention, the processing liquid supplying apparatus further includes a fifth filter which is interposed in the return pipe downstream from the portion to be cooled and removes particles in a processing liquid. Thus, even where the processing liquid passes through the portion to be cooled of the return pipe to produce particles, the particles in the processing liquid can be removed sufficiently by the fifth filter. Further, the fifth filter is interposed in the return pipe downstream from the portion to be cooled, thus making it possible to suppress more effectively contamination of the processing liquid tank.

In one preferred embodiment of this invention, the first heating unit includes a first tubular pipe which has an inner circumferential surface that faces an outer circumferential surface of the upstream-side portion to be heated and a first heating fluid supplying unit which supplies a heating fluid between the outer circumferential surface of the upstream-side portion to be heated and the inner circumferential surface of the first tubular pipe.

According to the above-described configuration, a heating fluid is supplied between the outer circumferential surface of the upstream-side portion to be heated in the supply pipe and the inner circumferential surface of the first tubular pipe. Thus, the upstream-side portion to be heated is surrounded by the heating fluid. Therefore, it is possible to heat uniformly a processing liquid which flows through the upstream-side portion to be heated.

In one preferred embodiment of this invention, the second heating unit includes a second tubular pipe which has an inner circumferential surface that faces an outer circumferential surface of the downstream-side portion to be heated and a second heating fluid supplying unit which supplies a heating fluid between the outer circumferential surface of the downstream-side portion to be heated and the inner circumferential surface of the second tubular pipe.

According to the above-described configuration, a heating fluid is supplied between the outer circumferential surface of the downstream-side portion to be heated in the supply pipe and the inner circumferential surface of the second tubular pipe. Thus, the downstream-side portion to be heated is surrounded by the heating fluid. Therefore, it is possible to heat uniformly a processing liquid which flows through the downstream-side portion to be heated.

In one preferred embodiment of this invention, the first heating unit may include a first heater which is disposed at the upstream-side portion to be heated of the supply pipe. The second heating unit may also include a second heater which is disposed at the downstream-side portion to be heated of the supply pipe.

In one preferred embodiment of this invention, the cooling unit includes a third tubular pipe which has an inner circumferential surface that faces an outer circumferential surface of the portion to be cooled of the return pipe and a cooling fluid supplying unit which supplies a cooling fluid between the outer circumferential surface of the portion to be cooled and the inner circumferential surface of the third tubular pipe.

According to the above-described configuration, a cooling fluid is supplied between the outer circumferential surface of the return pipe and the inner circumferential surface of the second tubular pipe. Thus, the portion to be cooled is surrounded by the cooling fluid. Therefore, it is possible to cool uniformly a processing liquid which flows through the portion to be cooled.

In one preferred embodiment of this invention, the processing liquid supplying apparatus further includes a branched supply pipe which is branched and connected to the supply pipe upstream from the branched position to supply a processing liquid to a processing unit different from the processing unit and a branched heating unit which heats a portion to be heated that is set in the branched supply pipe.

According to the above-described configuration, a processing liquid can be supplied to a plurality of processing units. The processing liquid which is supplied through the branched supply pipe to the processing unit is heated by the branched heating unit when passing through the portion to be heated. Therefore, the processing liquid is sufficiently heated by the first heating unit and the branched heating unit before reaching the processing unit.

One preferred embodiment of this invention provides a substrate processing apparatus which includes the processing liquid supplying apparatus and the processing unit. The above-described configuration is able to provide the same effects as those described previously.

One preferred embodiment of this invention provides a processing liquid supplying method which includes a supplying step of supplying a processing liquid inside a processing liquid tank that stores the processing liquid to a processing unit by way of a supply pipe, a circulating step of returning the processing liquid inside the supply pipe by way of a return pipe branched and connected to the supply pipe to the processing liquid tank, thereby circulating the processing liquid inside the processing liquid tank through the supply pipe and the return pipe, a first heating step of heating a processing liquid inside an upstream-side portion to be heated that is set in the supply pipe upstream from a branched position to which the return pipe is connected, a cooling step of cooling a processing liquid inside a portion to be cooled that is set in the return pipe, a removing step of removing particles in a processing liquid by a filter interposed in the supply pipe upstream from the upstream-side portion to be heated, and a second heating step of heating a processing liquid inside a downstream-side portion to be heated that is set in the supply pipe downstream from the branched position.

According to the above-described method, the processing liquid inside the processing liquid tank passes through the filter interposed in the supply pipe upstream from the upstream-side portion to be heated and is, thereafter, supplied to the processing unit. That is, the processing liquid passes through the filter before being heated by the first heating unit.

Further, when being circulated by way of the supply pipe and the return pipe, the processing liquid is heated by the first heating unit when passing through the upstream-side portion to be heated of the supply pipe and cooled by the cooling unit when passing through the portion to be cooled of the return pipe. Thus, the processing liquid passes through the filter in a state of being sufficiently cooled. Therefore, the processing liquid is circulated through the supply pipe and the return pipe, by which particles in the processing liquid can be thoroughly removed.

On the other hand, the processing liquid moving from the supply pipe to the processing unit is heated by the first heating unit when passing through the upstream-side portion to be heated and, thereafter, further heated by the second heating unit when passing through the downstream-side portion to be heated. Therefore, the processing liquid is sufficiently heated by the first heating unit and the second heating unit before reaching the processing unit.

As described so far, it is possible to supply to the processing unit the processing liquid from which particles are thoroughly removed and which is sufficiently heated.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2C is an illustrative sectional view for describing a configuration example of the opening/closing valve provided in the processing liquid supplying apparatus, showing the opening/closing valve in the closed state.

FIG. 3 is a block diagram for describing an electrical configuration of major portions in the processing liquid supplying apparatus.

DETAILED DESCRIPTION OF THE PREFERRED EMBODIMENTS

Figure 1:
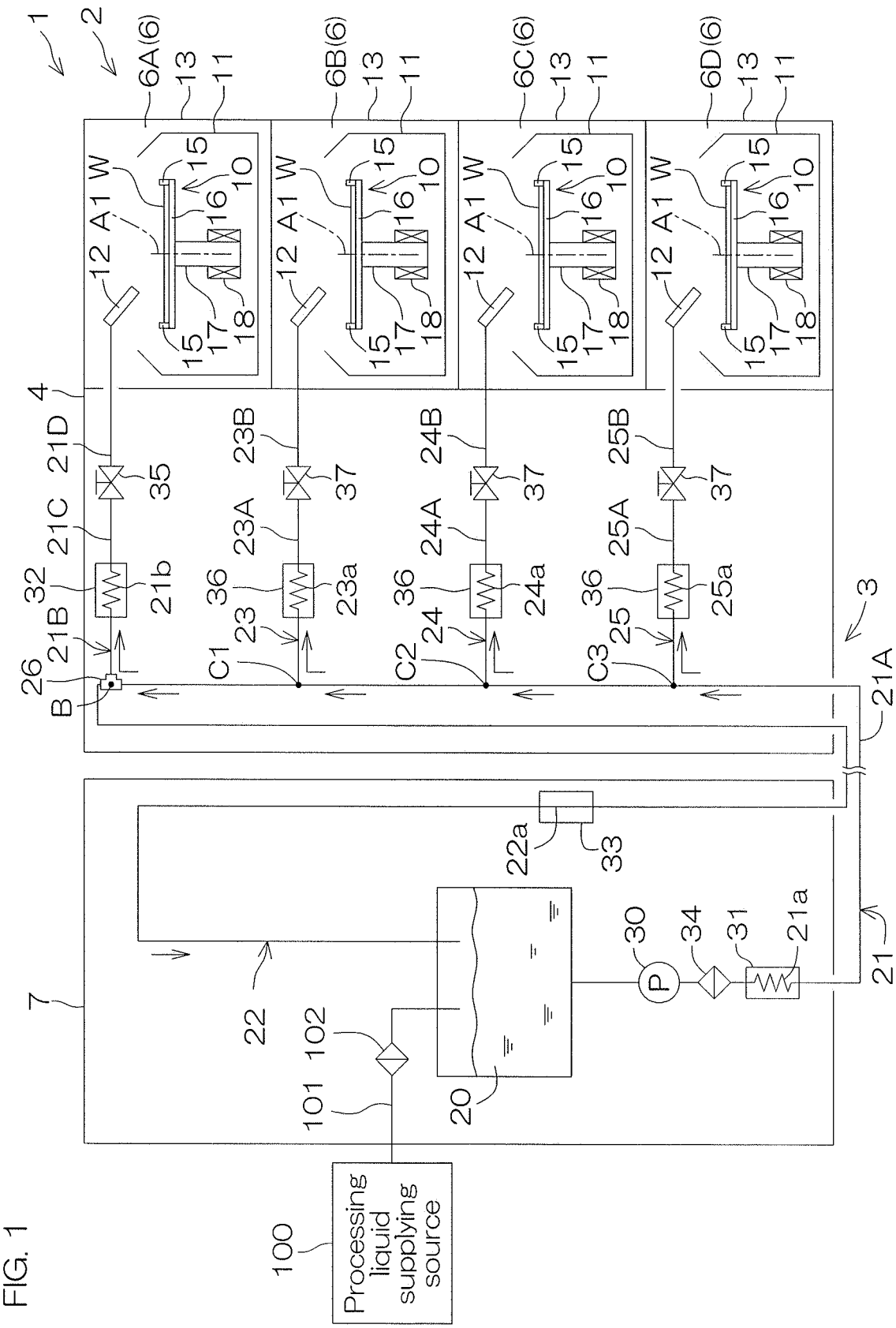
FIG. 1 is a schematic view which shows a configuration of a processing liquid supplying apparatus provided in a substrate processing apparatus according to a first preferred embodiment of this invention.

FIG. 1 is a schematic view which shows a configuration of a processing liquid supplying apparatus 3 provided in a substrate processing apparatus 1 according to the first preferred embodiment of this invention. The substrate processing apparatus 1 is a single substrate processing type apparatus which processes substrates W such as silicon wafers one by one. In the present preferred embodiment, the substrate W is a disk-shaped substrate.

The substrate processing apparatus 1 includes a processing tower 2 which processes a substrate W by a processing liquid, a processing liquid supplying apparatus 3 which supplies the processing liquid to the processing tower 2, a fluid unit 4 which houses a pipe for supplying the processing liquid to the processing tower 2, and a controller 5 which controls the substrate processing apparatus 1 (refer to FIG. 3 which will be described later).

The processing tower 2 includes a plurality (four in the present preferred embodiment) of processing units 6 which are stacked one on top of the other. The plurality of processing units 6 are, for example, similar in configuration. When the plurality of processing units 6 are identified, the processing unit 6 which is disposed uppermost is referred to as a processing unit 6A, the processing unit 6 which is adjacent to the processing unit 6A from below is referred to as a processing unit 6B, the processing unit 6 which is adjacent to the processing unit 6B from below is referred to as a processing unit 6C, and the processing unit 6 which is adjacent to the processing unit 6C from below is referred to as a processing unit 6D.

The processing liquid includes a chemical liquid, a rinsing liquid, an organic solvent and others. The chemical liquid is, for example, hydrofluoric acid (hydrogen fluoride water: HF). As a matter of course, the chemical liquid is not restricted to hydrofluoric acid and may be a liquid which contains at least one of sulfuric acid, acetic acid, nitric acid, hydrochloric acid, hydrofluoric acid, buffered hydrofluoric acid (BHF), diluted hydrofluoric acid (DHF), ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor. As examples of a chemical liquid in which the above are mixed, SPM (sulfuric acid-hydrogen peroxide mixture), SC1 (ammonia-hydrogen peroxide mixture), SC2 (hydrochloric acid-hydrogen peroxide mixture), etc., can be cited.

The rinsing liquid is, for example, deionized water (DIW). The rinsing liquid is not restricted to DIW and may be carbonated water, electrolyzed ion water, ozone water, aqueous hydrochloric acid solution of dilute concentration (of, for example, approximately 10 ppm to 100 ppm), ammonia water, or reduced water (hydrogen water).

The organic solvent is, for example, IPA (isopropyl alcohol). The organic solvent is not restricted to IPA. Specifically, the organic solvent may be a liquid containing at least one of IPA, HFE (hydrofluoroether), methanol, ethanol, acetone and trans-1,2-dichloroethylene. Further, the organic solvent is not necessarily composed of a single component alone and may be a mixture which is mixed with other components. For example, it may be a mixture of an IPA solution and pure water or a mixture of an IPA solution and an HFE solution.

The processing unit 6 includes a spin chuck 10, a cup 11, a processing liquid nozzle 12 and a processing chamber 13. The spin chuck 10 holds a single substrate W in a horizontal posture while rotating the substrate W around a perpendicular rotational axis A1 passing through a central portion of the substrate W. The cup 11 surrounds the spin chuck 10 and receives a processing liquid splashed from the substrate W. The processing liquid nozzle 12 supplies a processing liquid to an upper surface of the substrate W. The processing chamber 13 houses the spin chuck 10, the cup 11 and the processing liquid nozzle 12.

The spin chuck 10 includes a plurality of chuck pins 15, a spin base 16, a rotating shaft 17 and an electric motor 18. On an upper surface of the spin base 16, the plurality of chuck pins 15 are disposed at intervals in a circumferential direction. The plurality of chuck pins 15 grip the substrate W such that the substrate W can rotate integrally with the spin base 16. The rotating shaft 17 extends in a perpendicular direction along the rotational axis A1. An upper end of the rotating shaft 17 is coupled to a lower surface center of the spin base 16. The electric motor 18 applies a rotating force to the rotating shaft 17, thereby rotating the spin base 16 and the substrate W.

The processing liquid supplying apparatus 3 includes a processing liquid tank 20 which stores a processing liquid, a supply pipe 21 which supplies the processing liquid fed from the processing liquid tank 20 to the processing unit 6A, and a return pipe 22 which returns the processing liquid inside the supply pipe 21 to the processing liquid tank 20.

An upstream end of the supply pipe 21 is connected to the processing liquid tank 20. A downstream end of the supply pipe 21 is connected to the processing liquid nozzle 12 of the processing unit 6A.

An upstream end of the return pipe 22 is branched and connected to the supply pipe 21 at a return pipe branched position B. A downstream end of the return pipe 22 is connected to the processing liquid tank 20.

The processing liquid tank 20 is housed in a cabinet 7 adjacent to the fluid unit 4. In addition to the supply pipe 21 and the return pipe 22, a pipe 101 which supplies a processing liquid from a processing liquid supplying source 100 to the processing liquid tank 20 is connected to the processing liquid tank 20. A metal removing filter 102 for removing metal ions in a processing liquid is interposed in the pipe 101. The metal removing filter 102 includes, for example, a PTFE (polytetrafluoroethylene) hydrophilic membrane and an ion exchange membrane as a filtration membrane. The PTFE hydrophilic membrane is a membrane in which a front surface of a PTFE-made base material is hydrophilized.

The supply pipe 21 and the return pipe 22 extend around the cabinet 7 and the fluid unit 4. The supply pipe 21 includes a first pipe 21A upstream from the return pipe branched position B and a second pipe 21B downstream from the return pipe branched position B. The return pipe branched position B is provided with a joint (connecting portion) 26 to which the downstream end of the first pipe 21A, the upstream end of the second pipe 21B and the upstream end of the return pipe 22 are connected.

The processing liquid supplying apparatus 3 further includes a plurality of branched supply pipes 23 to 25 (a first branched supply pipe 23, a second branched supply pipe 24 and a third branched supply pipe 25) which are branched and connected to the supply pipe 21 upstream from the return pipe branched position B.

The branched supply pipes 23 to 25 supply a processing liquid to processing units 6B to 6D different from the processing unit 6A. Specifically, the first branched supply pipe 23 supplies a processing liquid inside the supply pipe 21 to the processing unit 6B. An upstream end of the first branched supply pipe 23 is connected to the supply pipe 21 at a first supply pipe branched position C1 upstream from the return pipe branched position B. A downstream end of the first branched supply pipe 23 is connected to a processing liquid nozzle 12 of the processing unit 6B.

The second branched supply pipe 24 supplies a processing liquid inside the supply pipe 21 to the processing unit 6C. An upstream end of the second branched supply pipe 24 is connected to the supply pipe 21 at a second supply pipe branched position C2 upstream from the first supply pipe branched position C1. A downstream end of the second branched supply pipe 24 is connected to a processing liquid nozzle 12 of the processing unit 6C.

The third branched supply pipe 25 supplies a processing liquid inside the supply pipe 21 to the processing unit 6D. An upstream end of the third branched supply pipe 25 is connected to the supply pipe 21 at a third supply pipe branched position C3 upstream from the second supply pipe branched position C2. A downstream end of the third branched supply pipe 25 is connected to a processing liquid nozzle 12 of the processing unit 6D.

The processing liquid supplying apparatus 3 includes a pump 30, an upstream-side heater 31, a downstream-side heater 32, a cooler 33, a first filter 34, an opening/closing valve 35, a plurality of branched pipe heaters 36 and a plurality of branched pipe opening/closing valves 37.

The pump 30 is interposed in the first pipe 21A of the supply pipe 21 upstream from the third supply pipe branched position C3 (upstream from the return pipe branched position B). The pump 30 delivers a processing liquid inside the processing liquid tank 20 to the supply pipe 21.

The upstream-side heater 31 heats a processing liquid inside an upstream-side portion to be heated 21a set at a part of the supply pipe 21. The upstream-side portion to be heated 21a is positioned upstream from the third supply pipe branched position C3 (upstream from the return pipe branched position B). The upstream-side heater 31 is disposed in the supply pipe 21 upstream from the third supply pipe branched position C3 and also downstream from the pump 30. The upstream-side heater 31 is an example of the first heating unit.

The first filter 34 is a particle removing filter for removing particles in a processing liquid which flows through the supply pipe 21. The first filter 34 is interposed in the supply pipe 21 upstream from the upstream-side portion to be heated 21a and also downstream from the pump 30. A filter which is used appropriately at an ordinary temperature (for example, approximately 5° C.~25° C.) is used as the first filter 34. The first filter 34 includes, for example, a PTFE hydrophilic membrane as a filtration membrane. A pore diameter of the PTFE hydrophilic membrane used as the first filter 34 is smaller than 7 nm, for example.

The cooler 33 is disposed in the return pipe 22. The cooler 33 is an example of the cooling unit which cools a processing liquid inside a portion to be cooled 22a that is set in the return pipe 22. The first filter 34, the upstream-side heater 31, the pump 30 and the cooler 33 are disposed in the cabinet 7.

The downstream-side heater 32 heats a processing liquid inside a downstream-side portion to be heated 21b set at a part of the supply pipe 21. The downstream-side portion to be heated 21b is positioned in the supply pipe 21 downstream from the return pipe branched position B. The downstream-side heater 32 is disposed in the supply pipe 21 downstream from the return pipe branched position B. The downstream-side heater 32 is an example of the second heating unit.

The opening/closing valve 35 is interposed in the second pipe 21B of the supply pipe 21. That is, the opening/closing valve 35 is interposed in the supply pipe 21 downstream from the return pipe branched position B. The opening/closing valve 35 is a valve which opens and closes a flow path of the processing liquid in the second pipe 21B. The second pipe 21B includes an upstream-side pipe 21C, the downstream end of which is connected to an opening/closing valve 35, and a downstream-side pipe 21D, the upstream end of which is connected to the opening/closing valve 35.

The branched pipe heater 36 is a heater which heats a processing liquid downstream from the supply pipe branched positions C1 to C3. One branched pipe heater 36 is disposed in each of the branched supply pipes 23 to 25. The branched pipe heater 36 disposed in the first branched supply pipe 23 is an example of the branched heating unit which heats a portion to be heated 23a that is set in the branched supply pipe 23. The branched pipe heater 36 disposed in the second branched supply pipe 24 is an example of the branched heating unit which heats a portion to be heated 24a that is set in the second branched supply pipe 24. The branched pipe heater 36 disposed in the third branched supply pipe 25 is an example of the branched heating unit which heats a portion to be heated 25a set in the third branched supply pipe 25.

The branched pipe opening/closing valves 37 are each a valve which opens and closes a flow path of a processing liquid in the branched supply pipes 23 to 25. The branched pipe opening/closing valves 37 are each interposed in the corresponding branched supply pipes 23 to 25 downstream from the branched pipe heater 36.

The first branched supply pipe 23 includes an upstream-side pipe 23A, the downstream end of which is connected to the branched pipe opening/closing valve 37, and a downstream-side pipe 23B, the upstream end of which is connected to the branched pipe opening/closing valve 37. The second branched supply pipe 24 includes an upstream-side pipe 24A, the downstream end of which is connected to the branched pipe opening/closing valve 37, and a downstream-side pipe 24B, the upstream end of which is connected to the branched pipe opening/closing valve 37. The third branched supply pipe 25 includes an upstream-side pipe 25A, the downstream end of which is connected to the branched pipe opening/closing valve 37, and a downstream-side pipe 25B, the upstream end of which is connected to the branched pipe opening/closing valve 37.

The downstream-side heater 32, the opening/closing valve 35, the plurality of branched pipe heaters 36 and the plurality of branched pipe opening/closing valves 37 are disposed in the fluid unit 4.

Figure 2A:
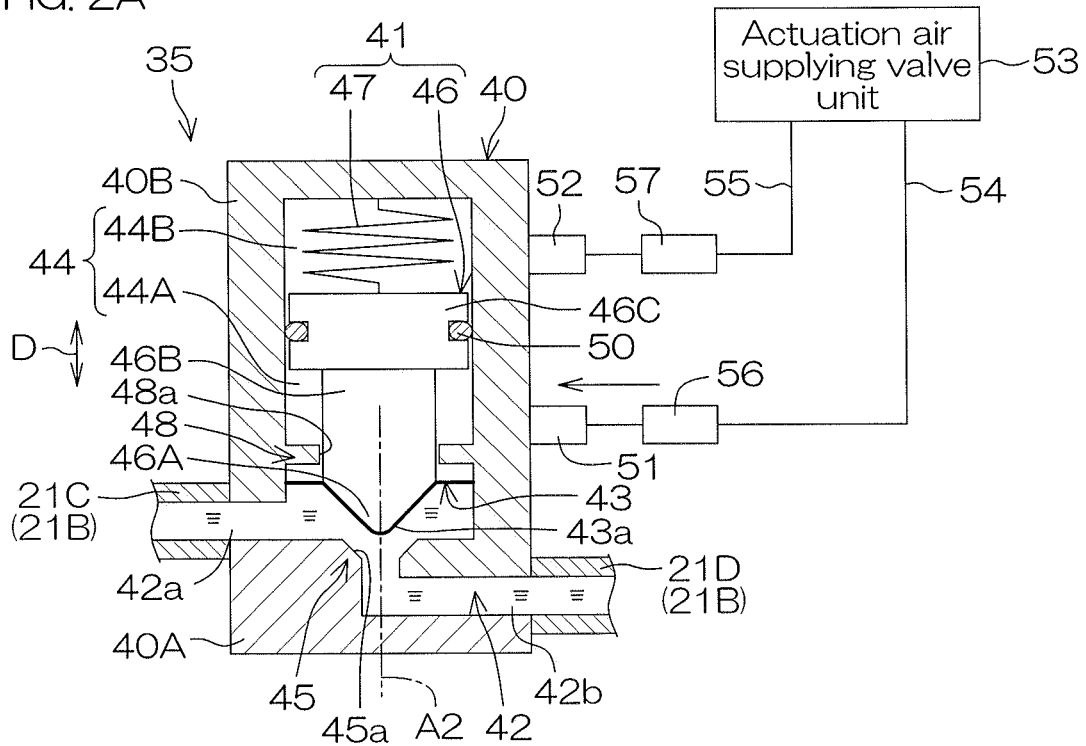
FIG. 2A is an illustrative sectional view for describing a configuration example of an opening/closing valve provided in the processing liquid supplying apparatus, showing the opening/closing valve in an open state.
Figure 2B:
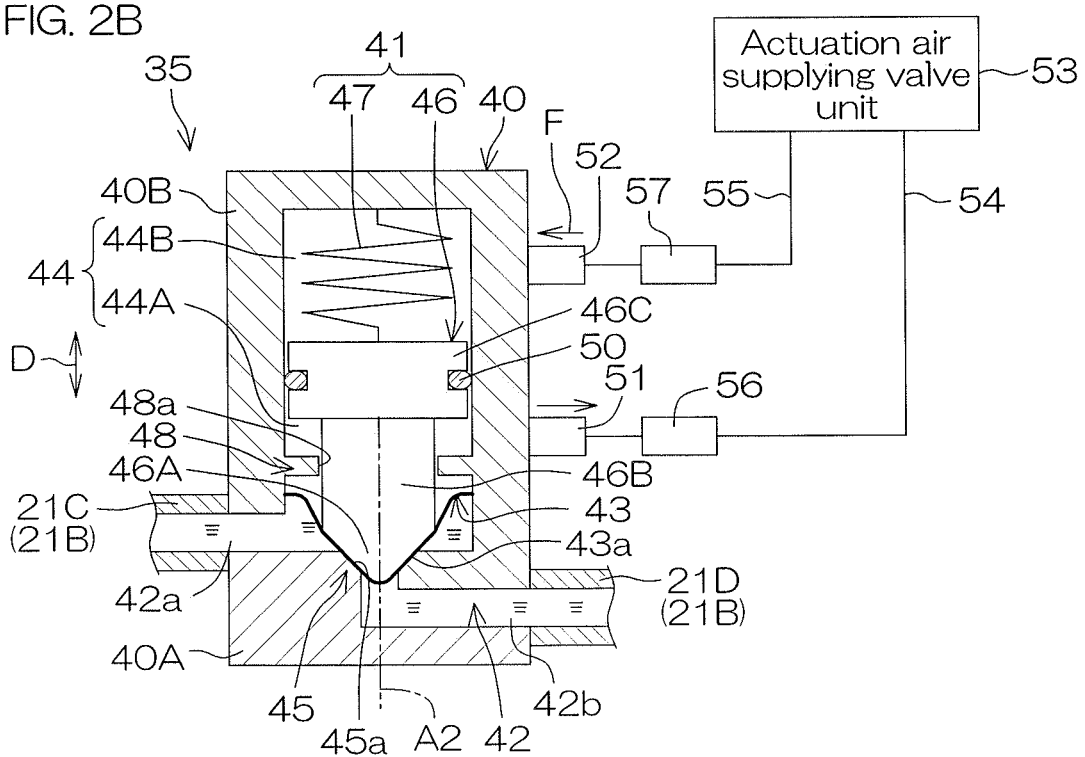
FIG. 2B is an illustrative sectional view for describing a configuration example of the opening/closing valve provided in the processing liquid supplying apparatus, showing the opening/closing valve in a state which is between the open state and a closed state.

Next, a detailed description will be given of a configuration of the opening/closing valve 35. FIG. 2A to 2C are each an illustrative sectional view for describing a configuration example of the opening/closing valve 35.

A state that the opening/closing valve 35 is opened is referred to as an open state. A state that the opening/closing valve 35 is closed is referred to as a closed state. FIG. 2A shows the opening/closing valve 35 in the open state. FIG. 2B shows the opening/closing valve 35 which is in an intermediate state between the open state and the closed state. FIG. 2C shows the opening/closing valve 35 in the closed state.

The opening/closing valve 35 is a diaphragm valve. The opening/closing valve 35 includes a housing 40, a driving portion 41 which opens and closes the opening/closing valve 35 and a diaphragm 43. The housing 40 includes a flow path forming portion 40A in which a flow path 42 for flowing a processing liquid is formed and a housing space forming portion 40B in which a housing space 44 for housing the driving portion 41 is formed.

The flow path 42 includes an inlet port 42a provided at one end of the flow path 42 and an outlet port 42b provided at the other end of the flow path 42. A downstream end of the upstream-side pipe 21C of the second pipe 21B is connected to the inlet port 42a. An upstream end of the downstream-side pipe 21D of the second pipe 21B is connected to the outlet port 42b.

As shown in FIG. 2A, when the opening/closing valve 35 is in the open state, a processing liquid which has been supplied to the upstream-side pipe 21C is supplied to the downstream-side pipe 21D through the flow path 42. As shown in FIG. 2C, when the opening/closing valve 35 is in the closed state, a processing liquid which has been supplied to the upstream-side pipe 21C is blocked midway through the flow path 42.

An intermediate portion of the flow path 42 is bent, for example, in an S-letter shape. A valve seat 45 is provided at a portion which defines the intermediate portion of the flow path 42 in the housing 40. The valve seat 45 is formed in a circular annular shape around a central axis A2. The valve seat 45 has a truncated cone-shaped seat surface 45a around the central axis A2.

The housing space 44 is formed in a cylindrical shape extending along the central axis A2. The driving portion 41 includes a shaft 46 and a compression coil spring 47. The shaft 46 extends along the central axis A2. The shaft 46 includes a circular shaft portion 46A when viewed in a direction along the central axis A2, a pressed-in portion 46B provided at one end of the shaft portion 46A, and a piston 46C provided at the other end of the shaft portion 46A. The pressed-in portion 46B has a conical shape which is tapered toward a seat surface 45a, and the conical shape thereof has the central axis A2 in common.

The diaphragm 43 is formed with a resin or others which can be elastically deformed. The diaphragm 43 is fixed inside the housing 40. The diaphragm 43 faces the seat surface 45a in a direction at which the central axis A2 of the seat surface 45a of the valve seat 45 extends (an opening/closing direction D which will be described later).

The flow path 42 and the housing space 44 are communicatively connected to each other but separated by the diaphragm 43. The diaphragm 43 prevents leakage of a processing liquid from the flow path 42 to the housing space 44.

The diaphragm 43 has a contact surface 43a which is able to come into contact with the seat surface 45a of the valve seat 45. The contact surface 43a is along the pressed-in portion 46B. Thus, the contact surface 43a is formed in a cone shape and has the central axis A2 in common with the seat surface 45a.

The driving portion 41 elastically deforms the diaphragm 43, thereby allowing the contact surface 43a to move horizontally between a closed position (a position shown in FIG. 2C) and an open position (a position shown in FIG. 2A) in the opening/closing direction D. The closed position is a position at which the contact surface 43a is in surface contact with the seat surface 45a such that the flow path 42 can be closed, and the open position is a position at which the contact surface 43a is away from the seat surface 45a and the flow path 42 is opened. Further, the opening/closing direction D is a direction along the central axis A2.

A flange portion 48 which extends inward in a radial direction centered at the central axis A2 is formed in the housing 40. A guide hole 48a which guides the shaft portion 46A of the shaft 46 in the opening/closing direction D is defined by the flange portion 48.

The housing space 44 is separated by the piston 46C into a space on the side of the diaphragm 43 from the piston 46C and a space opposite to the side of the diaphragm 43 from the piston 46C. A portion on the side of the diaphragm 43 from the piston 46C in the housing space 44 is referred to as a first space 44A. And a portion opposite to the side of the diaphragm 43 from the piston 46C is referred to as a second space 44B. The shaft 46 moves in the opening/closing direction D, by which the first space 44A and the second space 44B are changed in size.

A clearance between an outer circumferential surface of the piston 46C and an inner circumferential surface of the housing space forming portion 40B is sealed by a sealing member 50 (for example, an O-ring) attached to the piston 46C. The housing 40 includes a first port 51 which is communicatively connected to the first space 44A and a second port 52 which is communicatively connected to the second space 44B.

The processing liquid supplying apparatus 3 includes an actuation air supplying valve unit 53, a first air pipe 54, a second air pipe 55, a first speed controller 56 and a second speed controller 57. The first air pipe 54 is connected to the actuation air supplying valve unit 53 and the first port 51. The second air pipe 55 is connected to the actuation air supplying valve unit 53 and the second port 52.

The first speed controller 56 is interposed in the first air pipe 54. The first speed controller 56 controls a flow rate of air which flows inside the first air pipe 54, thereby adjusting a moving speed of the piston 46C.

The second speed controller 57 is interposed in the second air pipe 55. The second speed controller 57 controls a flow rate of air which flows inside the second air pipe 55, thereby adjusting a moving speed of the piston 46C.

The compression coil spring 47 is disposed in the second space 44B in a state of being compressed elastically. The piston 46C is pressed toward the diaphragm 43 in the opening/closing direction D by a restoring force of the compression coil spring 47. As shown in FIG. 2B and FIG. 2C, in a state that no air is supplied to the first space 44A, the diaphragm 43 is pressed to the valve seat 45 by the restoring force of the compression coil spring 47. That is, the opening/closing valve 35 is a constantly closed valve which is configured to be closed in a state that no air is supplied to the first space 44A.

Next, a description will be given of opening/closing operations of the opening/closing valve 35.

First, a description will be given of operations for opening the opening/closing valve 35 in the closed state. The actuation air supplying valve unit 53 supplies air to the first space 44A by way of the first port 51. Thereby, the first space 44 is increased in air pressure. On the other hand, the actuation air supplying valve unit 53 releases the second space 44B to the atmosphere by way of the second port 52.

When the first space 44A is increased in air pressure and the second space 44B is decreased in air pressure, as shown in FIG. 2A, the piston 46C is pressed to the side opposite to the diaphragm 43 by air pressure and moves to the side opposite to the diaphragm 43 against the restoring force of the compression coil spring 47. Thus, the shaft 46 in its entirety moves to the side opposite to the diaphragm 43, and the contact surface 43a moves in parallel toward the open position in the opening/closing direction D. Thereby, the contact surface 43a is disposed at the open position. That is, the opening/closing valve 35 is opened.

Next, a description will be given of operations for closing the opening/closing valve 35 in the open state. The actuation air supplying valve unit 53 releases the first space 44A to the atmosphere by way of the first port 51. Thereby, the first space 44A is decreased in air pressure. Further, the actuation air supplying valve unit 53 supplies air to the second space 44B by way of the second port 52, by which the second space 44B is increased in air pressure.

The first space 44A is released to the atmosphere, thereby weakening a force which presses the piston 46C to the side opposite to the diaphragm 43. Thus, the piston 46C is pressed to the side of the diaphragm 43 by the restoring force of the compression coil spring 47, and the contact surface 43a moves in parallel toward the closed position in the opening/closing direction D. Thereby, as shown in FIG. 2B, the contact surface 43a comes into contact with the seat surface 45a and is pressed thereto.

A flow rate F of air supplied to the second space 44B is adjusted by the second speed controller 57 such that an air pressure of the second space 44B can act on the piston 46C (an air pressure of the second space 44B becomes maximum) after the contact surface 43a has come into contact with the seat surface 45a. Thereby, timing at which the air pressure of the second space 44B becomes maximum can be made later than timing at which the contact surface 43a comes into contact with the seat surface 45a. It is, thereby, possible to reduce an impact when the contact surface 43a comes into contacted with the seat surface 45a. Therefore, it is possible to suppress the occurrence of particles resulting from the impact when the contact surface 43a comes into contact with the seat surface 45a.

In the opening/closing valve 35 which is in the closed state, the contact surface 43a is kept at the closed position by both the restoring force of the compression coil spring 47 and air pressure of the second space 44B. Therefore, even where abnormalities are found in one of the compression coil spring 47 and the actuation air supplying valve unit 53 when the opening/closing valve 35 is in the closed state, it is possible to keep the contact surface 43a in the closed position. It is, thereby, possible to block a processing liquid midway through the flow path 42.

Each of the branched pipe opening/closing valves 37 may be similar in configuration to the opening/closing valve 35. In this case, downstream ends of the upstream-side pipes 23A to 25A (refer to FIG. 1) of the branched supply pipes 23 to 25 are connected to the inlet port 42a, and upstream ends of the downstream-side pipes 23B to 25B (refer to FIG. 1) of the branched supply pipes 23 to 25 are connected to the outlet port 42b.

FIG. 3 is a block diagram for describing an electrical configuration of major portions in the substrate processing apparatus 1. The controller 5 is provided with a microcomputer and controls control targets provided on the substrate processing apparatus 1 according to a predetermined program. More specifically, the controller 5 includes a processor (CPU) 5A and a memory 5B which stores programs and is configured to carry out various types of control for substrate processing by the processor 5A which performs a program. The controller 5 controls, in particular, operations of the electric motor 18, the cooler 33, the heaters 31, 32, 36, the pump 30, the actuation air supplying valve unit 53, etc.

Next, a description will be given of one example of supplying a processing liquid to a substrate W by the processing liquid supplying apparatus 3.

In supplying a processing liquid, the controller 5 first activates the pump 30, the cooler 33 and the heaters 31, 32, 36. In the processing liquid supplying apparatus 3, the valves 35, 37 are both closed when the pump 30 is activated. The pump 30 is activated, by which a processing liquid stored in the processing liquid tank 20 is fed to the supply pipe 21. Then, the processing liquid which passes through the supply pipe 21 is returned to the processing liquid tank 20 by way of the return pipe 22. Since the valves 35, 37 are closed, the processing liquid inside the processing liquid tank 20 is not supplied to the processing unit 6 but circulated so as to be returned to the processing liquid tank 20 through the supply pipe 21 and the return pipe 22 (circulating step).

The processing liquid which is circulated is heated by the upstream-side heater 31 when passing through the upstream-side portion to be heated 21a of the supply pipe 21 (first heating step) and cooled by the cooler 33t when passing through the portion to be cooled 22a of the return pipe 22 (cooling step). Thus, the processing liquid passes through the first filter 34 in a state of being sufficiently cooled. Therefore, it is possible to thoroughly remove particles in the processing liquid by the first filter 34 (removing step).

Thereafter, supply of a processing liquid to the processing unit 6 is started by opening the valves 35, 37 which corresponding to the processing unit 6A to 6D that needs to supply the processing liquid.

Specifically, when the opening/closing valve 35 is opened, a processing liquid starts to flow in the supply pipe 21 downstream (the second pipe 21B) from the return pipe branched position B. Thereby, the processing liquid inside the processing liquid tank 20 is supplied to the processing unit 6A by way of the supply pipe 21 (supplying step).

The processing liquid moving from the supply pipe 21 to the processing unit 6A is heated by the upstream-side heater 31 when passing through the upstream-side portion to be heated 21a and, thereafter, further heated by the downstream-side heater 32 when passing through the downstream-side portion to be heated 21b (second heating step). Therefore, the processing liquid is sufficiently heated by the upstream-side heater 31 and the downstream side heater 32 before reaching the processing unit 6A.

On the other hand, when the branched pipe opening/closing valve 37 is opened, the processing liquid starts to flow into the corresponding branched supply pipes 23 to 25, and moves to the corresponding processing units 6B to 6D. The processing liquid which moves from the supply pipe 21 toward the processing units 6B to 6D is heated by the upstream-side heater 31 when passing through the upstream-side portion to be heated 21a and, thereafter, heated by the branched pipe heater 36 when passing through the portion to be heated 23a to 25a. Therefore, the processing liquid is sufficiently heated by the upstream-side heater 31 and the corresponding branched pipe heater 36 before reaching the processing units 6B to 6D.

As described so far, the processing liquid from which particles are thoroughly removed and which are sufficiently heated can be supplied to the processing unit 6.

The first filter 34 includes a PTFE hydrophilic membrane as the filtration membrane. Thus, where an organic solvent such as IPA is used as a processing liquid, residue generated when hydrophilizing a PTFE base material may be discharged into a processing liquid during passage of IPA that is high in temperature through the first filter 34. Further, a hydrophilic group of the PTFE hydrophilic membrane may be damaged by IPA that is high in temperature. In the present preferred embodiment, the processing liquid which passes through the first filter 34 is sufficiently cooled by the cooler 33. Therefore, it is possible to suppress the occurrence of particles even where the PTFE hydrophilic membrane is used in the first filter 34.

The pump 30 may be activated in a state that at least one of the opening/closing valve 35 and the plurality of branched pipe opening/closing valves 37 is opened. Even in this case, a processing liquid passes through the first filter 34 at an ordinary temperature before supply to a substrate W. Thus, it is possible to supply to a substrate W the processing liquid from which particles are thoroughly removed.

Figure 4:
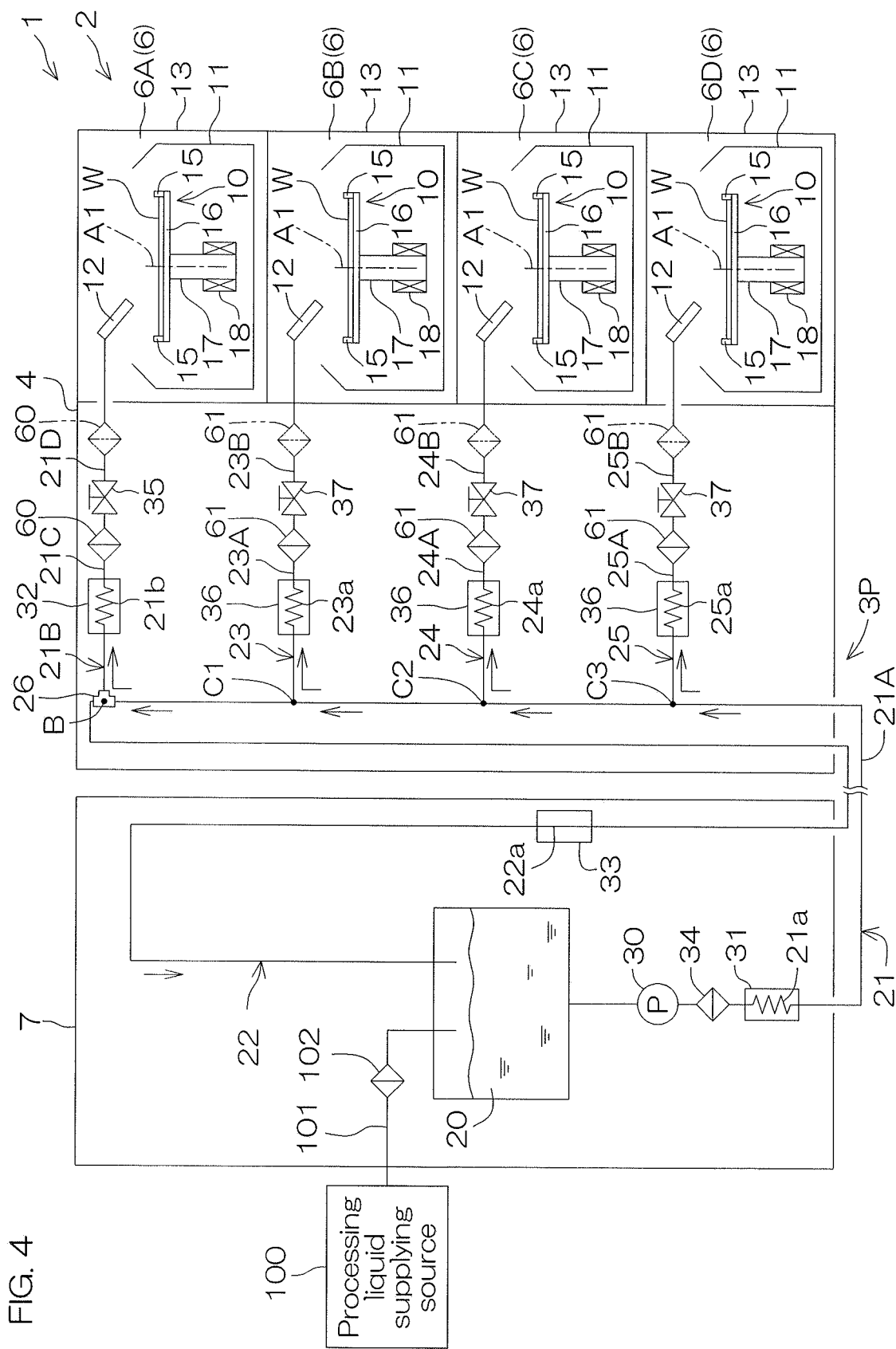
FIG. 4 is schematic view which shows a configuration of a processing liquid supplying apparatus provided in a substrate processing apparatus according to a second preferred embodiment of this invention.

FIG. 4 is a schematic view which shows a configuration of a processing liquid supplying apparatus 3P according to the second preferred embodiment of this invention. In FIG. 4, members that are the same as the members so far described are provided with the same reference symbols and a description thereof shall be omitted.

The processing liquid supplying apparatus 3P according to the second preferred embodiment is different from the processing liquid supplying apparatus 3 (refer to FIG. 1) according to the first preferred embodiment in that the processing liquid supplying apparatus 3P includes a second filter 60 which is interposed in a supply pipe 21 downstream from a return pipe branched position B and also upstream from an opening/closing valve 35 and a branched pipe filter 61 which is interposed in branched supply pipes 23 to 25 upstream from a branched pipe opening/closing valve 37.

The second filter 60 is a particle removing filter for removing particles in a processing liquid which flows through the supply pipe 21. A filter which is appropriately used at a high temperature rather than at an ordinary temperature is used as the second filter 60. The second filter 60 includes, for example, a PTFE hydrophobic membrane as a filtration membrane. The PTFE hydrophobic membrane is a membrane having a PTFE base material in which a front surface thereof is not hydrophilized. A pore diameter of the PTFE hydrophobic membrane used as the second filter 60 is larger than 10 nm, for example.

The branched pipe filter 61 is a particle removing filter for removing particles in a processing liquid which flows through the corresponding branched supply pipes 23 to 25. As with the second filter 60, a filter which includes the PTFE hydrophobic membrane as a filtration membrane is used as the branched pipe filter 61. A pore diameter of the PTFE hydrophobic membrane used in the branched pipe filter 61 is larger than 10 nm, for example.

A processing liquid which has been heated passes through a joint 26 provided at the return pipe branched position B, by which the joint 26 may be expanded to produce particles by being heated.

According to the second preferred embodiment, the processing liquid supplying apparatus 3P includes the second filter 60. Thus, even where the joint 26 is expanded to produce particles in a processing liquid during passage of the processing liquid through the return pipe branched position B, it is possible to remove the particles by the second filter 60.

In one preferred embodiment of this invention, the second filter 60 is interposed in the supply pipe 21 upstream from the opening/closing valve 35. In general, a processing liquid passes through a filter, by which the processing liquid is decreased in flow rate. Therefore, the second filter 60 is positioned in the supply pipe 21 upstream from the opening/closing valve 35, thus making it possible to reduce an influence of the second filter 60 on a flow rate of the processing liquid ejected from a processing liquid nozzle 12.

Further, according to the second preferred embodiment, the branched pipe filter 61 is interposed in the branched supply pipes 23 to 25 upstream from the branched pipe opening/closing valve 37. Thus, it is possible to reduce an influence of the branched pipe filter 61 on a flow rate of the processing liquid ejected from the processing liquid nozzle 12.

Further, unlike the second preferred embodiment, as shown by a long-dashed double-dotted line in FIG. 4, the second filter 60 may be interposed in the supply pipe 21 downstream from the opening/closing valve 35. When the opening/closing valve 35 is in an open state, a processing liquid inside a processing liquid tank 20 is supplied to a processing unit 6A by way of the supply pipe 21. The second filter 60 is positioned in the supply pipe 21 downstream from the opening/closing valve 35. Therefore, even where particles occur during passage of the processing liquid through the opening/closing valve 35, the particles are removed by the second filter 60.

Still further, unlike the second preferred embodiment, as shown by a long-dashed double-dotted line in FIG. 4, the branched pipe filters 61 may be each interposed in the branched supply pipes 23 to 25 downstream from corresponding branched pipe opening/closing valves 37. Thereby, even where a processing liquid passes through the branched pipe opening/closing valve 37 to produce particles, the particles are removed by the branched pipe filter 61.

In addition, the second filter 60 may be provided at both positions upstream from the opening/closing valve 35 and downstream from the opening/closing valve 35. The branched pipe filter 61 may be provided at both positions upstream from the branched pipe opening/closing valve 37 and downstream from the branched pipe opening/closing valve 37.

Figure 5:
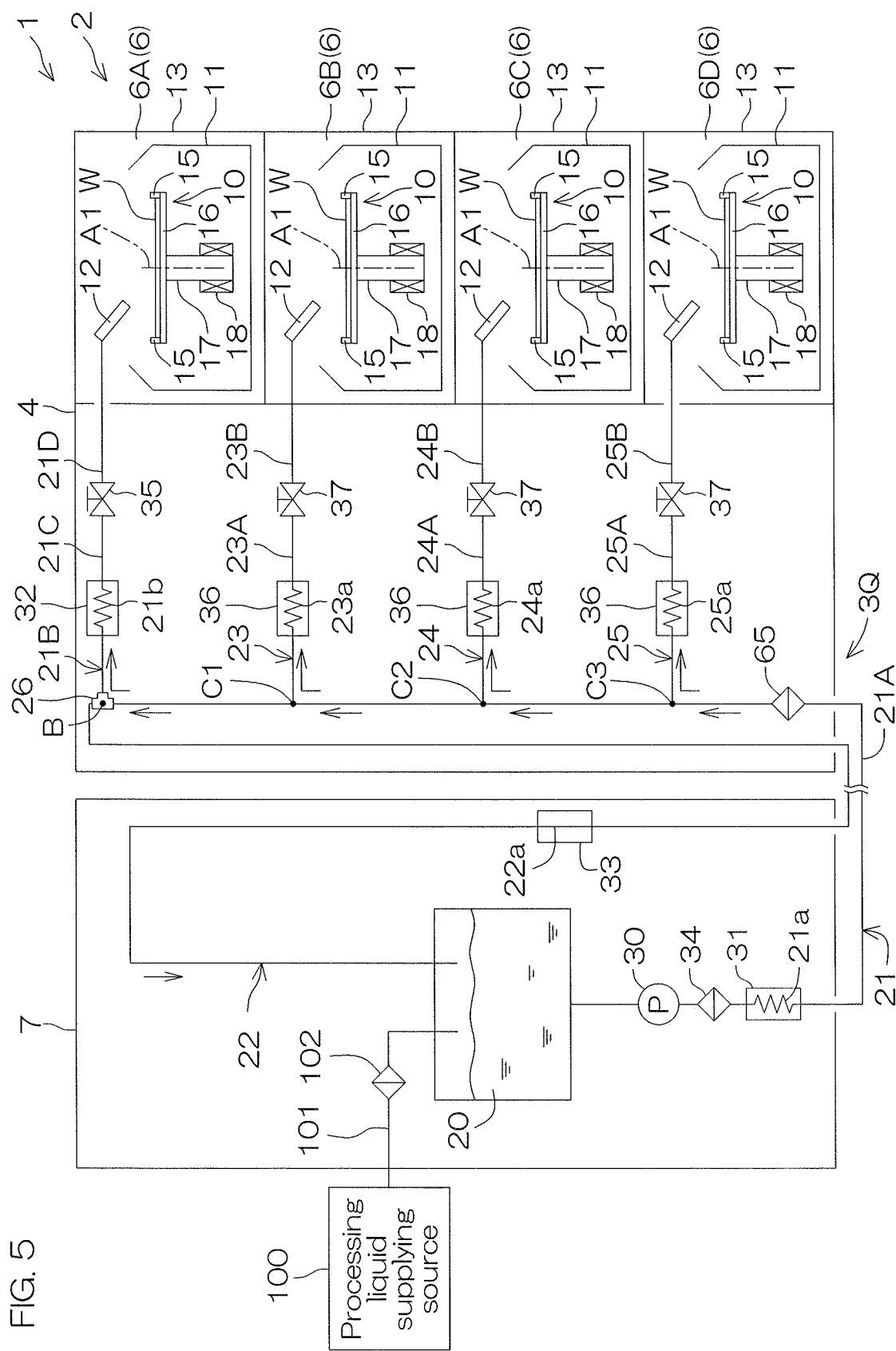
FIG. 5 is a schematic view which shows a configuration of a processing liquid supplying apparatus provided in a substrate processing apparatus according to a third preferred embodiment of this invention.

FIG. 5 is a schematic view which shows a configuration of a processing liquid supplying apparatus 3Q according to the third preferred embodiment of this invention. In FIG. 5, members that are the same as the members so far described are provided with the same reference symbols and a description thereof shall be omitted.

With reference to FIG. 5, the processing liquid supplying apparatus 3Q according to the third preferred embodiment is different from the processing liquid supplying apparatus 3 (refer to FIG. 1) according to the first preferred embodiment in that the processing liquid supplying apparatus 3Q includes a third filter 65 which is interposed in a supply pipe 21 downstream from an upstream-side portion to be heated 21a and also upstream from a third supply pipe branched position C3 (upstream from the return pipe branched position B).

The third filter 65 is a particle removing filter for removing particles in a processing liquid which flows through the supply pipe 21. A filter which is appropriately used at a high temperature rather than at an ordinary temperature is used as the third filter 65. The third filter 65 includes, for example, a PTFE hydrophobic membrane as a filtration membrane. A pore diameter of the PTFE hydrophobic membrane used in the third filter 65 is larger than 10 nm, for example.

A processing liquid which has been heated passes through the supply pipe 21, by which components which constitute the supply pipe 21 may be dissolved into the processing liquid to produce particles.

In one preferred embodiment of this invention, the processing liquid supplying apparatus 3Q includes the third filter 65. Thus, even where a processing liquid heated by the upstream-side heater 31 passes through the supply pipe 21 to produce particles in the processing liquid, it is possible to remove the particles by the third filter 65.

Figure 6:
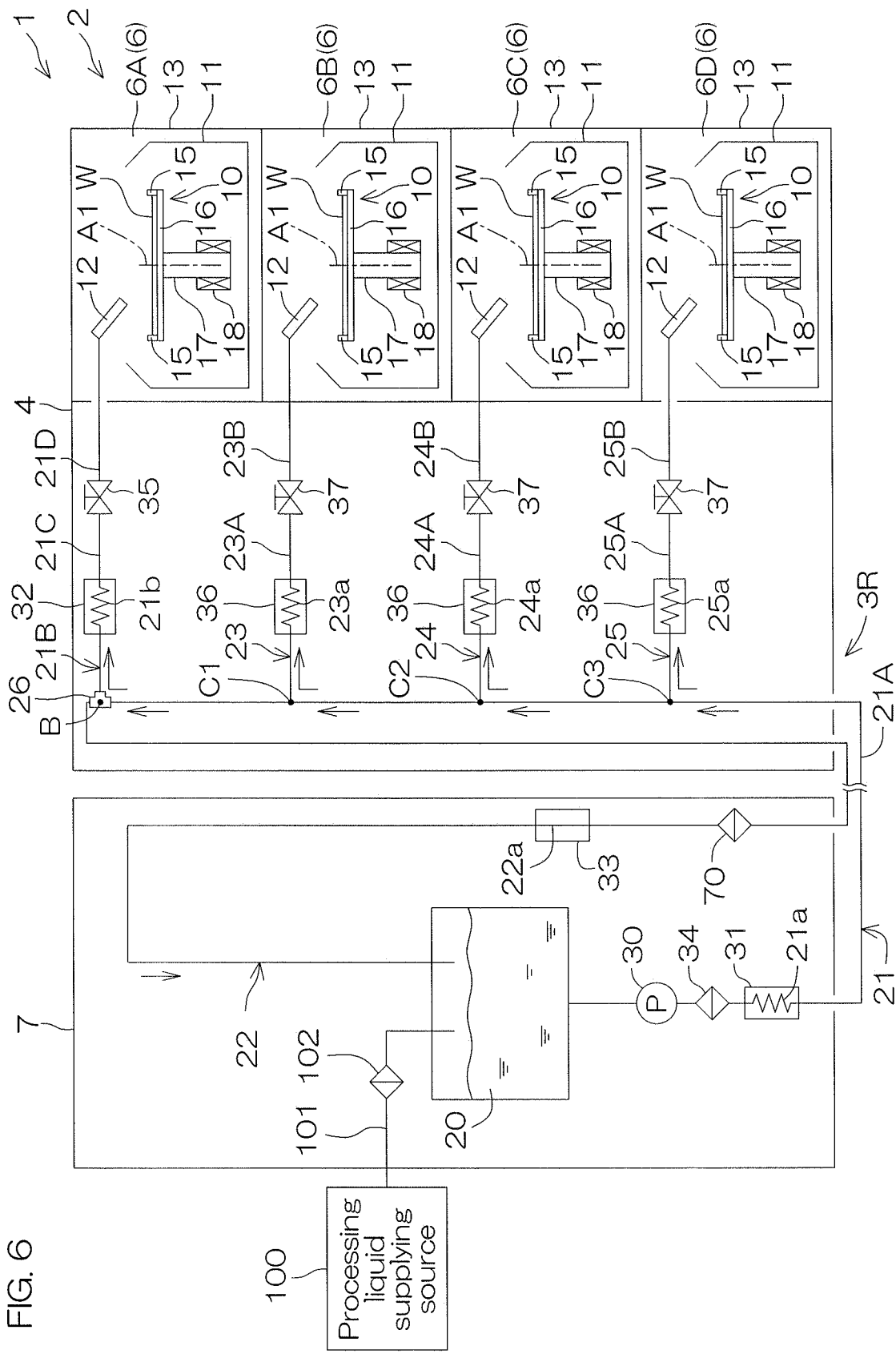
FIG. 6 is a schematic view which shows a configuration of a processing liquid supplying apparatus provided in a substrate processing apparatus according to a fourth preferred embodiment of this invention.

FIG. 6 is a schematic view which shows a configuration of a processing liquid supplying apparatus 3R according to the fourth preferred embodiment of this invention. In FIG. 6, members that are the same as the members so far described are provided with the same reference symbols, and a description thereof shall be omitted.

With reference to FIG. 6, the processing liquid supplying apparatus 3R according to the fourth preferred embodiment is different from the processing liquid supplying apparatus 3 (refer to FIG. 1) according to the first preferred embodiment in that the processing liquid supplying apparatus 3R further includes a fourth filter 70 which is interposed in a return pipe 22 upstream from a portion to be cooled 22a.

The fourth filter 70 is a particle removing filter for removing particles in a processing liquid which flows through the return pipe 22. A filter which is appropriately used at a high temperature rather than at an ordinary temperature is used as the fourth filter 70. The fourth filter 70 includes, for example, a PTFE hydrophobic membrane as a filtration membrane. A pore diameter of the PTFE hydrophobic membrane used in the fourth filter 70 is larger than 10 nm, for example.

The processing liquid which has been heated passes through the return pipe 22, by which components which constitute the return pipe 22 may dissolve into the processing liquid to produce particles.

According to the present preferred embodiment, the processing liquid supplying apparatus 3R includes the fourth filter 70. Therefore, even where a processing liquid which has been heated by an upstream-side heater 31 passes through the return pipe 22 to produce particles in the processing liquid, it is possible to remove the particles by the fourth filter 70. Further, the fourth filter 70 is interposed in the return pipe 22 downstream from a supply pipe 21. Therefore, it is possible to suppress contamination of a processing liquid tank 20 effectively as compared with a filter (first filter 34) which is interposed in the supply pipe 21.

Figure 7:
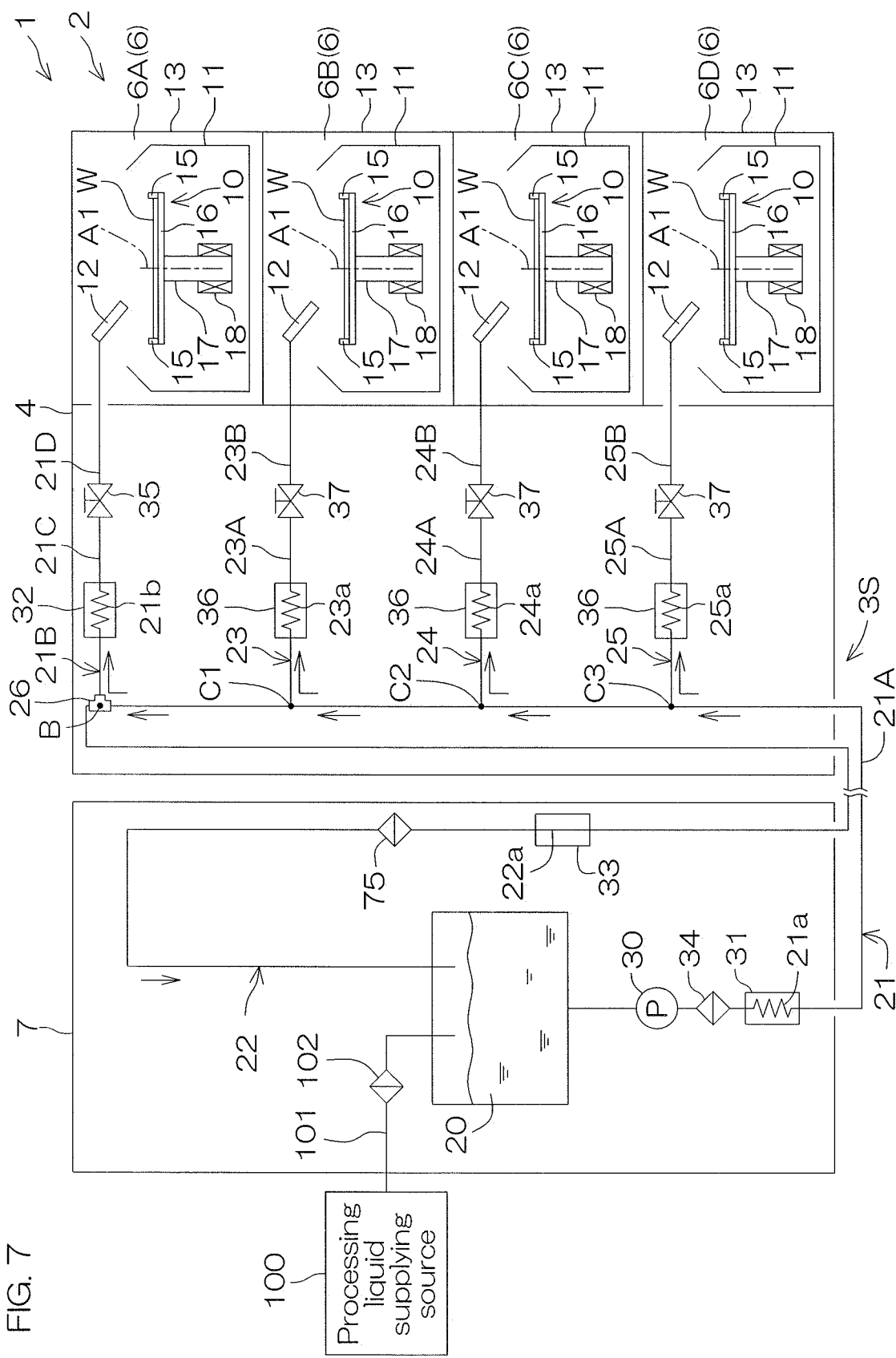
FIG. 7 is a schematic view which shows a configuration of a processing liquid supplying apparatus provided in a substrate processing apparatus according to a fifth preferred embodiment of this invention.

FIG. 7 is a schematic view which shows a configuration of a processing liquid supplying apparatus 3S according to the fifth preferred embodiment of this invention. In FIG. 7, members that are the same as the members so far described are provided with the same reference symbols and a description thereof shall be omitted.

With reference to FIG. 7, the processing liquid supplying apparatus 3S according to the fifth preferred embodiment is different from the processing liquid supplying apparatus 3 (refer to FIG. 1) according to the first preferred embodiment in that the processing liquid supplying apparatus 3S further includes a fifth filter 75 which is interposed in a return pipe 22 downstream from a portion to be cooled 22a.

The fifth filter 75 is a particle removing filter for removing particles in a processing liquid which flows through the return pipe 22. A filter which is appropriately used at an ordinary temperature (for example, approximately 5° C. to 25° C.) is used as the fifth filter 75. The fifth filter 75 includes, for example, a PTFE hydrophilic membrane as a filtration membrane. A pore diameter of the PTFE hydrophilic membrane used in the fifth filter 75 is smaller than 7 nm, for example.

Even where a processing liquid passes through a portion to be cooled 22a of the return pipe 22 to produce particles, due to the fifth filter 75 included in the processing liquid supplying apparatus 3S, it is possible to sufficiently remove the particles in the processing liquid by the fifth filter 75. Further, the fifth filter 75 is interposed in the return pipe 22 downstream from the portion to be cooled 22a and, it is, therefore, possible to suppress more effectively contamination of a processing liquid tank 20.

Figure 8:
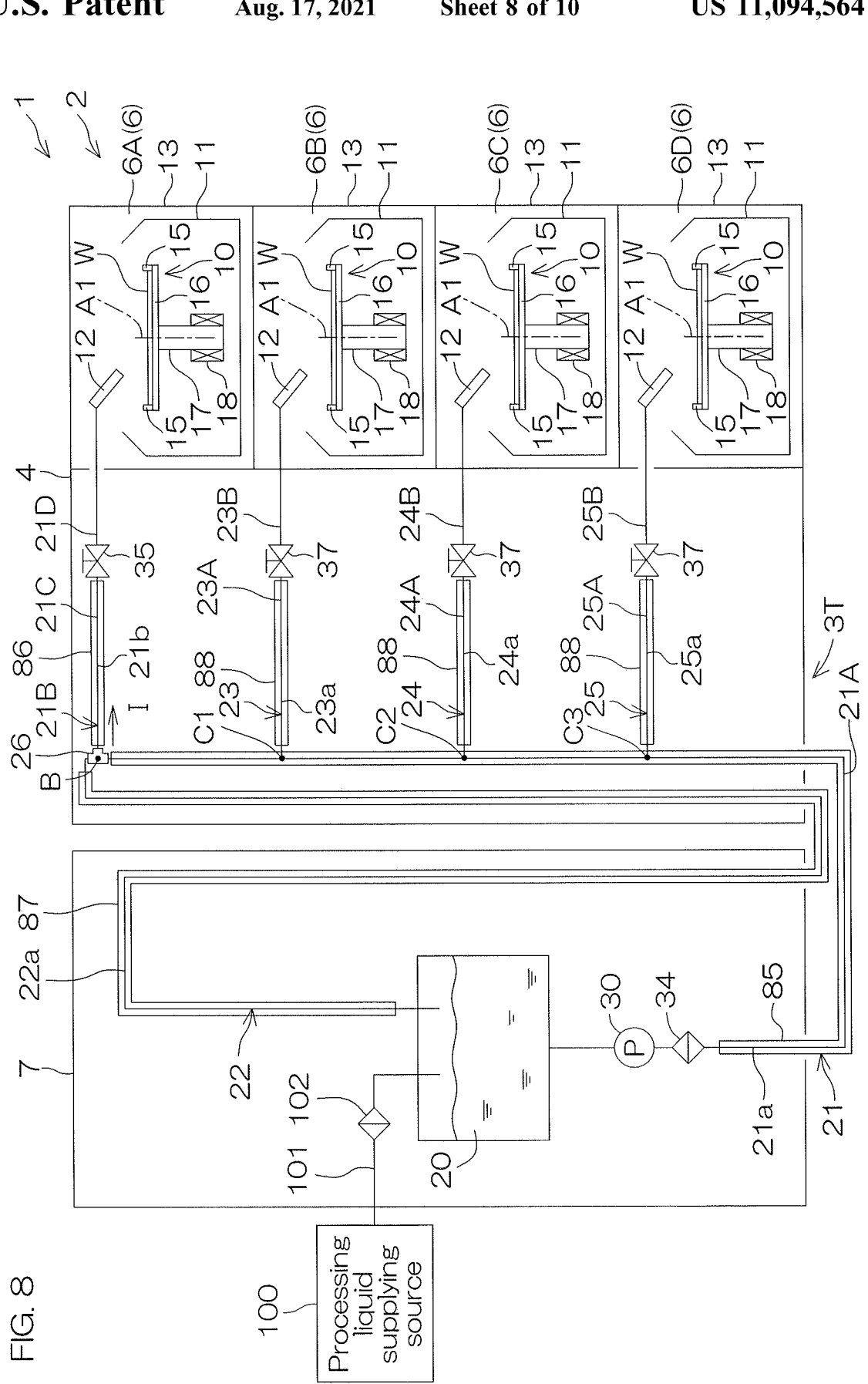
FIG. 8 is a schematic view which shows a configuration of a processing liquid supplying apparatus provided in a substrate processing apparatus according to a sixth preferred embodiment of this invention.

FIG. 8 is a schematic view which shows a configuration of a processing liquid supplying apparatus 3T according to the sixth preferred embodiment of this invention. In FIG. 8, members that are the same as the members so far described are provided with the same reference symbols and a description thereof shall be omitted.

With reference to FIG. 8, the processing liquid supplying apparatus 3T according to the sixth preferred embodiment is different from the processing liquid supplying apparatus 3 (refer to FIG. 1) according to the first preferred embodiment in that a supply pipe 21, a return pipe 22 and a plurality of branched supply pipes 23 to 25 each have a double pipe structure.

In detail, the processing liquid supplying apparatus 3T includes a first tubular pipe 85, a second tubular pipe 86, a third tubular pipe 87 and a plurality of branched tubular pipes 88. The first tubular pipe 85 is attached to a first pipe 21A of the supply pipe 21 downstream from a first filter 34. The second tubular pipe 86 is attached to an upstream-side pipe 21C of a second pipe 21B of the supply pipe 21. The third tubular pipe 87 is attached to the return pipe 22. The branched tubular pipes 88 are attached to upstream-side pipes 23A to 25C of the respective branched supply pipes 23 to 25.

Figure 9A:
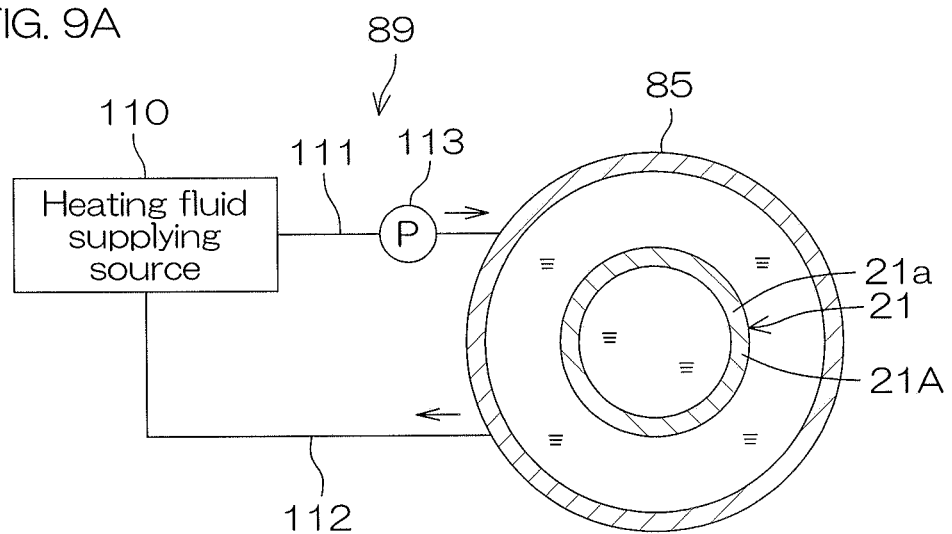
FIG. 9A is a sectional view which shows around a first tubular pipe provided in the processing liquid supplying apparatus according to the sixth preferred embodiment.
Figure 9B:
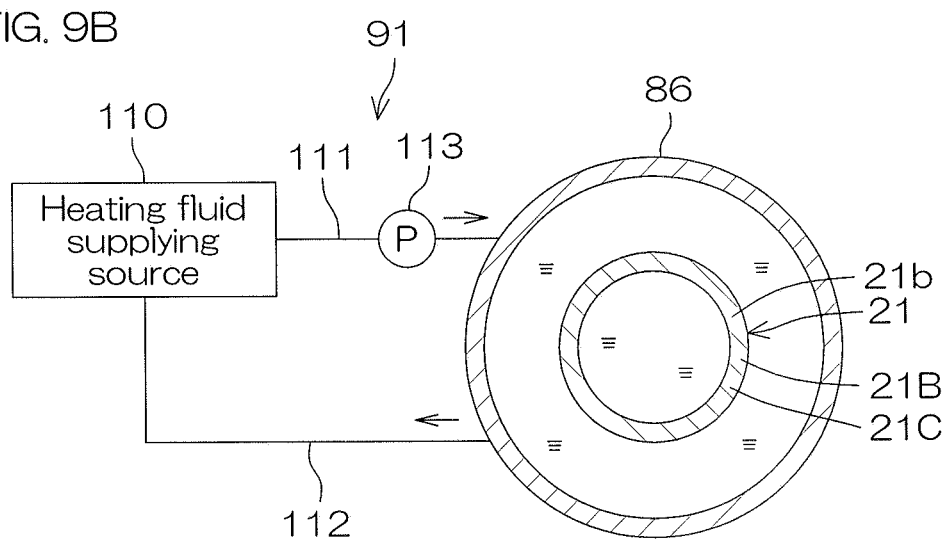
FIG. 9B is a sectional view which shows around a second tubular pipe provided in the processing liquid supplying apparatus according to the sixth preferred embodiment.
Figure 9C:
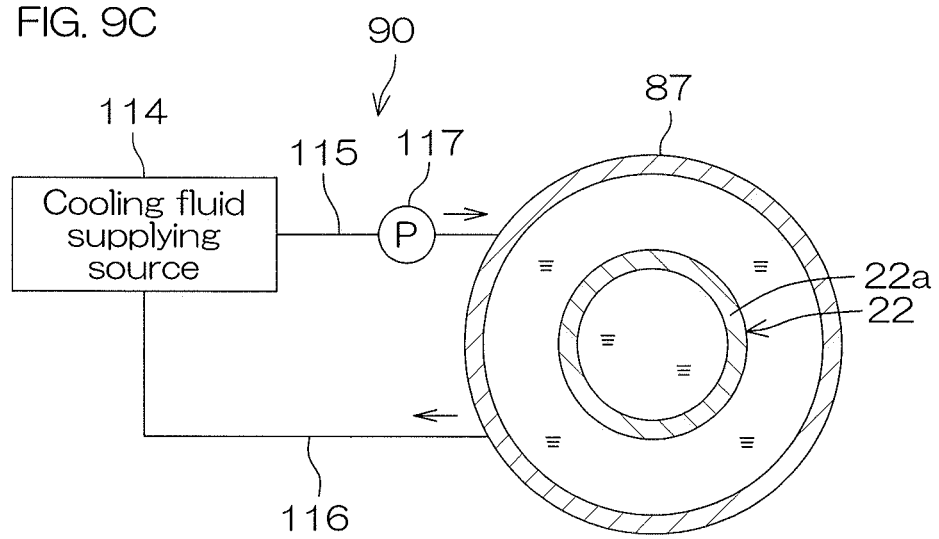
FIG. 9C is a sectional view which shows around a third tubular pipe provided in the processing liquid supplying apparatus according to the sixth preferred embodiment.
Figure 9D:
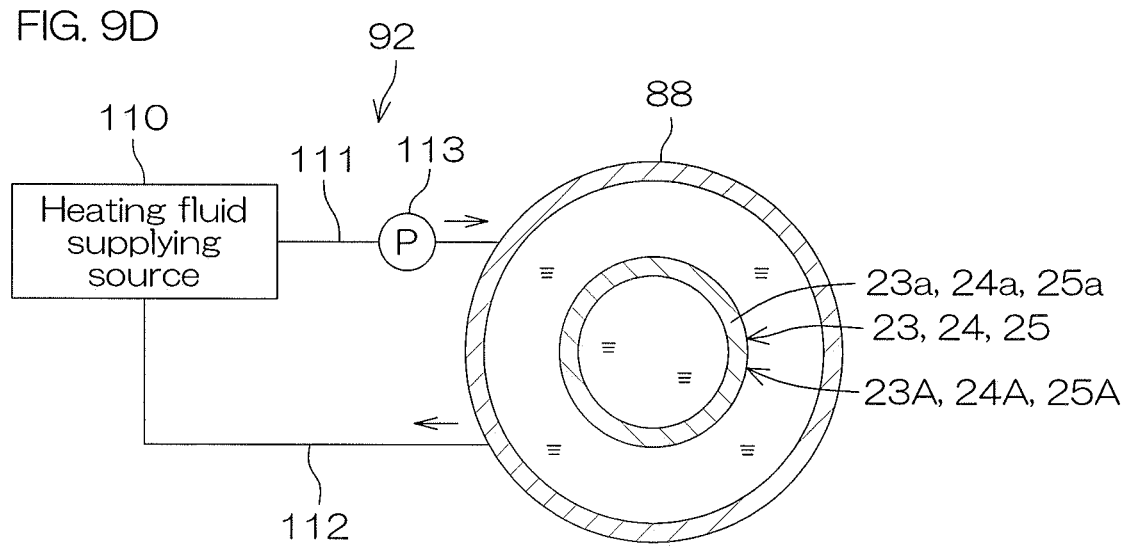
FIG. 9D is a sectional view which shows around a branched tubular pipe provided in the processing liquid supplying apparatus according to the sixth preferred embodiment.

FIG. 9A is a sectional view which shows around the first tubular pipe 85. FIG. 9B is a sectional view which shows around the second tubular pipe 86. FIG. 9C is a sectional view which shows around the third tubular pipe 87. FIG. 9D is a sectional view which shows around the branched tubular pipe 88.

As shown in FIG. 9A, the first tubular pipe 85 has an inner circumferential surface which faces an outer circumferential surface of the first pipe 21A of the supply pipe 21. The processing liquid supplying apparatus 3T includes a first heating fluid supplying unit 89 which supplies a heating fluid such as warm water between the outer circumferential surface of the first pipe 21A of the supply pipe 21 and the inner circumferential surface of the first tubular pipe 85. In the present preferred embodiment, a portion which faces the first tubular pipe 85 in the first pipe 21A of the supply pipe 21 is an upstream-side portion to be heated 21a. The first tubular pipe 85 and the first heating fluid supplying unit 89 constitute a first heating unit.

The first heating fluid supplying unit 89 includes, for example, a heating fluid supplying source 110 which stores a heating fluid, a heating fluid supply pipe 111 which supplies the heating fluid to the first tubular pipe 85, a heating fluid recovery pipe 112 which recovers the heating fluid from the first tubular pipe 85, and a pump 113 which is interposed in the heating fluid supply pipe 111. The pump 113 is controlled by a controller 5 (refer to FIG. 3).

As shown in FIG. 9B, the second tubular pipe 86 has an inner circumferential surface that faces an outer circumferential surface of the upstream-side pipe 21C in the second pipe 21B of the supply pipe 21. The processing liquid supplying apparatus 3 includes a second heating fluid supplying unit 91 which supplies a heating fluid between the outer circumferential surface of the second pipe 21B of the supply pipe 21 and the inner circumferential surface of the second tubular pipe 86. In the present preferred embodiment, a portion which faces the second tubular pipe 86 in the second pipe 21B of the supply pipe 21 is a downstream-side portion to be heated 21b. The second tubular pipe 86 and the second heating fluid supplying unit 91 constitute a second heating unit.

The second heating fluid supplying unit 91 is similar in configuration to the first heating fluid supplying unit 89.

That is, the second heating fluid supplying unit 91 includes a heating fluid supplying source 110, a heating fluid supply pipe 111 which supplies a heating fluid to the second tubular pipe 86, a heating fluid recovery pipe 112 which recovers the heating fluid from the second tubular pipe 86, and a pump 113.

As shown in FIG. 9C, the third tubular pipe 87 has an inner circumferential surface which faces an outer circumferential surface of the return pipe 22. The processing liquid supplying apparatus 3T includes a cooling fluid supplying unit 90 which supplies a cooling fluid such as cold water between the outer circumferential surface of the return pipe 22 and the third tubular pipe 87. In the present preferred embodiment, a portion which faces the third tubular pipe 87 in the return pipe 22 is a portion to be cooled 22a. The third tubular pipe 87 and the cooling fluid supplying unit 90 constitute a cooling unit.

The cooling fluid supplying unit 90 includes, for example, a cooling fluid supplying source 114 which stores a cooling fluid, a cooling fluid supply pipe 115 which supplies the cooling fluid to the third tubular pipe 87, a heating fluid recovery pipe 116 which recovers the cooling fluid from the third tubular pipe 87, and a pump 117 which is interposed in the cooling fluid supply pipe 115. The pump 117 is controlled by a controller 5 (refer to FIG. 3).

As shown in FIG. 9D, the branched tubular pipe 88 faces an outer circumferential surface of each of the corresponding upstream-side pipes 23A to 25A. The processing liquid supplying apparatus 3T includes a plurality of branched heating fluid supplying units 92 which supply a heating fluid between the outer circumferential surface of each of the upstream-side pipes 23A to 25A in the branched supply pipes 23 to 25 and the branched tubular pipe 88. In the present preferred embodiment, portions which face the branched tubular pipe 88 in the branched supply pipes 23 to 25 are portions to be heated 23a to 25a.

The branched heating fluid supplying unit 92 is similar in configuration to the first heating fluid supplying unit 89, for example. That is, the branched heating fluid supplying unit 92 includes a heating fluid supplying source 110, a heating fluid supply pipe 111 which supplies a heating fluid to the branched tubular pipe 88, a heating fluid recovery pipe 112 which recovers the heating fluid from the branched tubular pipe 88, and a pump 113.

According to the present preferred embodiment, a heating fluid is supplied between an outer circumferential surface of the upstream-side portion to be heated 21a of the supply pipe 21 and an inner circumferential surface of the first tubular pipe 85. Thus, the upstream-side portion to be heated 21a is surrounded by the heating fluid. Therefore, it is possible to heat uniformly the processing liquid which flows through the upstream-side portion to be heated 21a.

A heating fluid is also supplied between an outer circumferential surface of the downstream-side portion to be heated 21b of the supply pipe 21 and an inner circumferential surface of the second tubular pipe 86. Thus, the downstream-side portion to be heated 21b is surrounded by the heating fluid. Therefore, it is possible to heat uniformly a processing liquid which flows through the downstream-side portion to be heated 21b.

Further, a cooling fluid is supplied between an outer circumferential surface of the return pipe 22 and an inner circumferential surface of the second tubular pipe 86. Thus, the portion to be cooled 22a is surrounded by the cooling fluid. Therefore, it is possible to cool uniformly a processing liquid which flows through the portion to be cooled 22a.

Still further, a heating fluid is supplied between the outer circumferential surface of each of the portions to be heated 23a to 25a of the branched supply pipes 23 to 25 and an inner circumferential surface of the branched tubular pipe 88. Thus, the portions to be heated 23a to 25a are surrounded by the heating fluid. Therefore, it is possible to heat uniformly a processing liquid which flows through the branched supply pipes 23 to 25.

This invention shall not be restricted to the preferred embodiments so far described and can be carried out in other modes.

For example, the above-described preferred embodiments may be used in combination. That is, in addition to the first filter 34, such a configuration with two or more of the second filter 60, the third filter 65, the fourth filter 70, the fifth filter 75 and the branched pipe filter 61 may be provided.

Further, unlike the above-described preferred embodiments, the heaters 31, 32, 36 and the cooler 33 may be used together with the tubular pipes 85 to 88.

Further, unlike the above-described preferred embodiments, in place of the second speed controller 57, an electric pneumatic regulator for regulating air pressure may be provided.

Still further, unlike the above-described preferred embodiments, such a configuration with no second speed controller 57 may be provided. In this case, an actuation air supplying valve unit 53 may control a flow rate F of air supplied to a second space 44B such that air pressure of the second space 44B will act on a piston 46C (air pressure of the second space 44B becomes maximum) after a contact surface 43a comes into contact with a seat surface 45a. Thereby, timing at which the air pressure of the second space 44B becomes maximum can be made later than timing at which the contact surface 43a comes into contact with the seat surface 45a. It is, thereby, possible to reduce an impact when the contact surface 43a comes into contact with the seat surface 45a.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A processing liquid supplying apparatus which supplies a processing liquid to a processing unit for processing a substrate, the processing liquid supplying apparatus comprising:
a supply pipe to which a processing liquid inside a processing liquid tank that stores the processing liquid is fed and which supplies the processing liquid, which is fed from the processing liquid tank, to the processing unit;
a return pipe which is branched and connected to the supply pipe to return a processing liquid inside the supply pipe to the processing liquid tank;
a first heating unit which heats a processing liquid inside an upstream-side portion that is set in the supply pipe upstream from a branched position to which the return pipe is connected;
a second heating unit which heats a processing liquid inside a downstream-side portion that is set in the supply pipe downstream from the branched position;
a cooling unit which cools a processing liquid inside a portion that is set in the return pipe; and a first filter which is interposed in the supply pipe upstream from the upstream-side portion and removes particles in a processing liquid.

2. The processing liquid supplying apparatus according to claim 1, further comprising: a second filter which is interposed in the supply pipe downstream from the branched position and removes particles in a processing liquid.

3. The processing liquid supplying apparatus according to claim 2, further comprising: an opening/closing valve which is interposed in the supply pipe downstream from the branched position;
wherein the second filter is interposed in the supply pipe upstream from the opening/closing valve.

4. The processing liquid supplying apparatus according to claim 2, further comprising: an opening/closing valve which is interposed in the supply pipe downstream from the branched position;
wherein the second filter is interposed in the supply pipe downstream from the opening/closing valve.

5. The processing liquid supplying apparatus according to claim 2, wherein a pore diameter of the first filter is smaller than a pore diameter of the second filter.

6. The processing liquid supplying apparatus according to claim 2, wherein the second filter is a hydrophobic filter.

7. The processing liquid supplying apparatus according to claim 1, further comprising: a third filter which is interposed in the supply pipe downstream from the upstream-side portion which is heated by the first heating unit and also upstream from the branched position and removes particles in a processing liquid.

8. The processing liquid supplying apparatus according to claim 1, further comprising: a fourth filter which is interposed in the return pipe upstream from the portion which is cooled by the cooling unit and removes particles in a processing liquid.

9. The processing liquid supplying apparatus according to claim 1, further comprising: a fifth filter which is interposed in the return pipe downstream from the portion which is cooled by the cooling unit and removes particles in a processing liquid.

10. The processing liquid supplying apparatus according to claim 1, wherein the first heating unit includes a first tubular pipe which has an inner circumferential surface that faces an outer circumferential surface of the upstream-side portion of the supply pipe, and a first heating fluid supplying unit which supplies a heating fluid between the outer circumferential surface of the upstream-side portion of the supply pipe and the inner circumferential surface of the first tubular pipe.

11. The processing liquid supplying apparatus according to claim 7, wherein the third filter is a hydrophobic filter.

12. The processing liquid supplying apparatus according to claim 1, wherein the second heating unit includes a second tubular pipe which has an inner circumferential surface that faces an outer circumferential surface of the downstream-side portion of the supply pipe, and a second heating fluid supplying unit which supplies a heating fluid between the outer circumferential surface of the downstream-side portion of the supply pipe and the inner circumferential surface of the second tubular pipe.

13. The processing liquid supplying apparatus according to claim 1, wherein the first heating unit includes a first heater which is disposed at the upstream-side portion of the supply pipe, and
the second heating unit includes a second heater which is disposed at the downstream-side portion of the supply pipe.

14. The processing liquid supplying apparatus according to claim 1, wherein the cooling unit includes a third tubular pipe which has an inner circumferential surface that faces an outer circumferential surface of the portion of the return pipe, and a cooling fluid supplying unit which supplies a cooling fluid between the outer circumferential surface of the portion of the return pipe and the inner circumferential surface of the third tubular pipe.

15. The processing liquid supplying apparatus according to claim 8, wherein the fourth filter is a hydrophobic filter.

16. The processing liquid supplying apparatus according to claim 1, further comprising: a branched supply pipe that is branched and connected to the supply pipe upstream from the branched position to supply a processing liquid to a processing unit different from the processing unit; and
a branched heating unit which heats a portion that is set in the branched supply pipe.

17. A substrate processing apparatus comprising: the processing liquid supplying apparatus according to claim 1 and the processing unit.

18. The processing liquid supplying apparatus according to claim 1, wherein the cooling unit cools the processing liquid inside the portion that is set in the return pipe to ordinary temperature.

19. The processing liquid supplying apparatus according to claim 1, wherein the first filter is a hydrophilic filter.

20. The processing liquid supplying apparatus according to claim 1, wherein the processing liquid is an organic solvent.

21. The processing liquid supplying apparatus according to claim 20, wherein the organic solvent is IPA.

22. A processing liquid supplying method comprising:
a supplying step of supplying a processing liquid inside a processing liquid tank that stores the processing liquid to a processing unit by way of a supply pipe;
a circulating step of returning the processing liquid inside the supply pipe by way of a return pipe branched and connected to the supply pipe to the processing liquid tank, thereby circulating the processing liquid inside the processing liquid tank through the supply pipe and the return pipe;
a first heating step of heating a processing liquid inside an upstream-side portion that is set in the supply pipe upstream from a branched position to which the return pipe is connected;
a cooling step of cooling a processing liquid inside a portion that is set in the return pipe;
a removing step of removing particles in a processing liquid by a filter interposed in the supply pipe upstream from the upstream-side portion which is heated by the first heating unit; and
a second heating step of heating a processing liquid inside a downstream-side portion that is set in the supply pipe downstream from the branched position.

* * * * *